(12) United States Patent
Il et al.

(10) Patent No.: US 11,949,380 B2
(45) Date of Patent: Apr. 2, 2024

(54) METHOD OF MANUFACTURING OSCILLATOR AND OSCILLATOR

(71) Applicant: SEIKO EPSON CORPORATION, Tokyo (JP)

(72) Inventors: Naoki Il, Suwa (JP); Yosuke Itasaka, Minowa (JP)

(73) Assignee: SEIKO EPSON CORPORATION (JP)

( * ) Notice: Subject to any disclaimer, the term of this patent is extended or adjusted under 35 U.S.C. 154(b) by 0 days.

(21) Appl. No.: 18/161,401

(22) Filed: Jan. 30, 2023

(65) Prior Publication Data

US 2023/0246593 A1 Aug. 3, 2023

(30) Foreign Application Priority Data

Jan. 31, 2022 (JP) ................. 2022-012815

(51) Int. Cl.
*H03B 5/36* (2006.01)
*H03L 7/099* (2006.01)
*H03L 7/24* (2006.01)

(52) U.S. Cl.
CPC ............. *H03B 5/36* (2013.01); *H03B 5/362* (2013.01); *H03B 5/366* (2013.01); *H03L 7/099* (2013.01); *H03L 7/24* (2013.01); *H03B 2200/0038* (2013.01)

(58) Field of Classification Search
CPC .... H03B 5/04; H03B 5/36; H03B 2200/0038; H03B 5/366; H03B 5/362; H03L 7/099; H03L 7/24

USPC ................ 331/158, 116 R, 116 FE, 176
See application file for complete search history.

(56) References Cited

U.S. PATENT DOCUMENTS

2009/0236936 A1   9/2009  Tamura
2020/0274489 A1*  8/2020  Nishizawa ............... H03B 5/32

FOREIGN PATENT DOCUMENTS

JP    2009-232150 A    10/2009

* cited by examiner

*Primary Examiner* — Arnold M Kinkead
(74) *Attorney, Agent, or Firm* — Harness, Dickey & Pierce, P.L.C.

(57) ABSTRACT

A method of manufacturing an oscillator including housing a first resonator and a first integrated circuit device configured to oscillate the first resonator in a first container to manufacture the first oscillator, and housing a second resonator and a second integrated circuit device configured to oscillate the second resonator in a second container to manufacture the second oscillator, wherein the first integrated circuit device includes a first oscillation circuit configured to oscillate the first resonator to output a first oscillation signal, and no PLL circuit, the second integrated circuit device includes a second oscillation circuit configured to oscillate the second resonator to output a second oscillation signal, and a PLL circuit to which the second oscillation signal is input, and which is configured to output a third oscillation signal, and the first container and the second container are containers same in type.

13 Claims, 14 Drawing Sheets

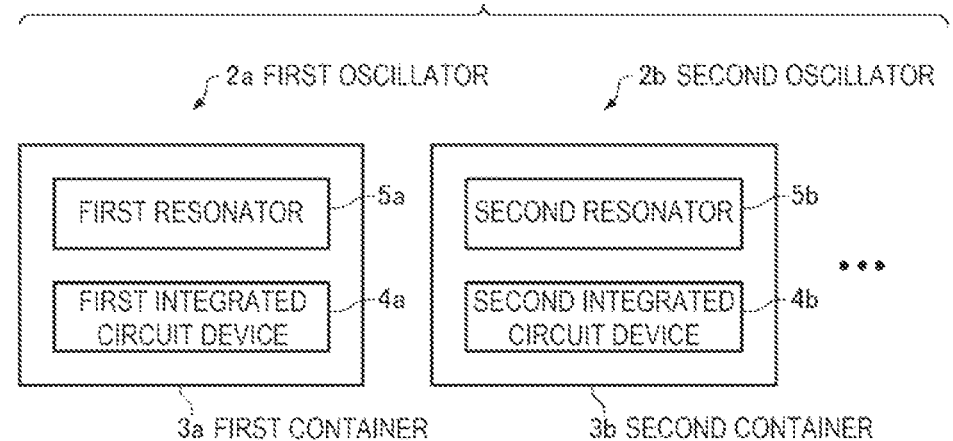
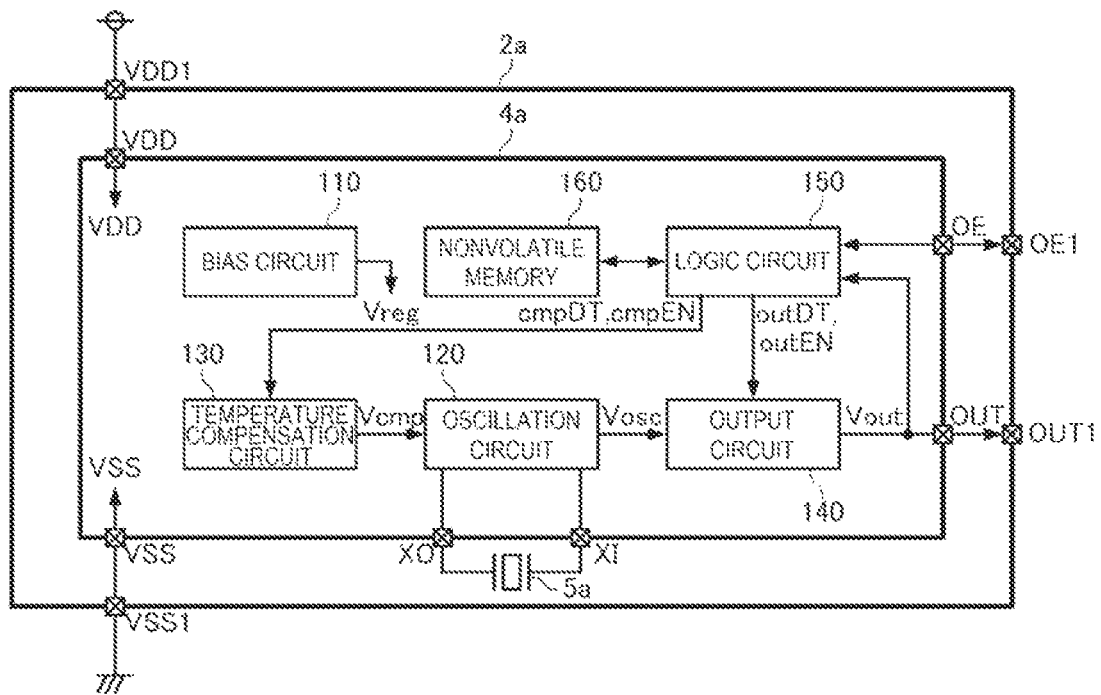

METHOD OF MANUFACTURING OSCILLATOR AND OSCILLATOR

The present application is based on, and claims priority from JP Application Serial Number 2022-012815, filed Jan. 31, 2022, the disclosure of which is hereby incorporated by reference herein in its entirety.

BACKGROUND

1. Technical Field

The present disclosure relates to a method of manufacturing an oscillator, and an oscillator.

2. Related Art

In JP-A-2009-232150 (Document 1), there is described a quartz crystal oscillator in which a quartz crystal resonator element and an IC chip are housed in a ceramic package, and the quartz crystal resonator element is fixed to a mount platform which is fixed inside the ceramic package with an adhesive. According to the quartz crystal oscillator described in Document 1, by changing a position where the mount platform is fixed inside the package, it is possible to house a plurality of types of quartz crystal resonator elements different in size and a plurality of types of IC chips different in size in a common package, and therefore, it is possible to increase the degree of design freedom related to the sizes of the quartz crystal resonator element and the IC chips.

However, in the method described in Document 1, there is room for improvement in order to efficiently manufacture a plurality of types of oscillators different in function related to output frequencies at low cost.

SUMMARY

A method of manufacturing an oscillator according to an aspect of the present disclosure is a method of manufacturing a plurality of types of oscillators including a first oscillator and a second oscillator, the method including housing a first resonator and a first integrated circuit device configured to oscillate the first resonator in a first container to manufacture the first oscillator, and housing a second resonator and a second integrated circuit device configured to oscillate the second resonator in a second container to manufacture the second oscillator, wherein the first integrated circuit device includes a first oscillation circuit configured to oscillate the first resonator to output a first oscillation signal, and no PLL circuit, the second integrated circuit device includes a second oscillation circuit configured to oscillate the second resonator to output a second oscillation signal, and a PLL circuit to which the second oscillation signal is input, and which is configured to output a third oscillation signal, and the first container and the second container are containers same in type.

An oscillator according to another aspect of the present disclosure is an oscillator included in an oscillator group consisting of a plurality of types of oscillators, the oscillator including a first resonator, a first integrated circuit device configured to oscillate the first resonator, and a first container configured to house the first resonator and the first integrated circuit device, wherein the first integrated circuit device includes a first oscillation circuit configured to oscillate the first resonator to output a first oscillation signal, and no PLL circuit, another oscillator included in the oscillator group includes a second resonator, a second integrated circuit device configured to oscillate the second resonator, and a second container configured to house the second resonator and the second integrated circuit device, the second integrated circuit device includes a second oscillation circuit configured to oscillate the second resonator to output a second oscillation signal, and a PLL circuit to which the second oscillation signal is input, and which is configured to output a third oscillation signal, and the first container and the second container are containers same in type.

An oscillator according to another aspect of the present disclosure is an oscillator included in an oscillator group consisting of a plurality of types of oscillators, the oscillator including a second resonator, a second integrated circuit device configured to oscillate the second resonator, and a second container configured to house the second resonator and the second integrated circuit device, wherein the second integrated circuit device includes a second oscillation circuit configured to oscillate the second resonator to output a second oscillation signal, and a PLL circuit to which the second oscillation signal is input, and which is configured to output a third oscillation signal, another oscillator included in the oscillator group includes a first resonator, a first integrated circuit device configured to oscillate the first resonator, and a first container configured to house the first resonator and the first integrated circuit device, the first integrated circuit device includes a first oscillation circuit configured to oscillate the first resonator to output a first oscillation signal, and no PLL circuit, and the first container and the second container are containers same in type.

BRIEF DESCRIPTION OF THE DRAWINGS

FIG. 1 is a diagram showing a configuration of an oscillator group.

FIG. 2 is a functional block diagram of a first oscillator.

DESCRIPTION OF EXEMPLARY EMBODIMENTS

Figure 3:
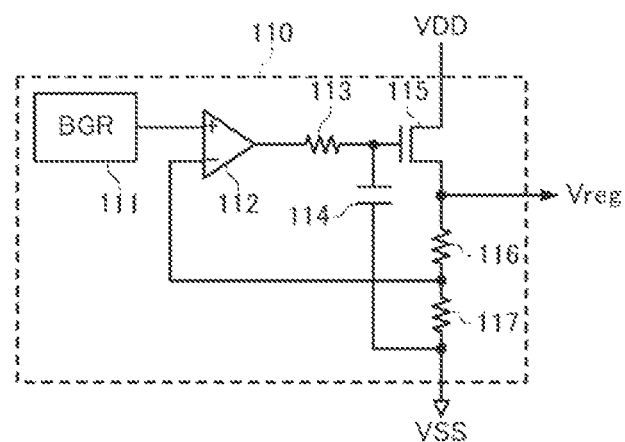
FIG. 3 is a diagram showing a configuration example of a bias circuit.

Some preferred embodiments of the present disclosure will hereinafter be described in detail using the drawings. It should be noted that the embodiments described below do not unreasonably limit the content of the present disclosure as set forth in the appended claims. Further, all of the constituents described below are not necessarily essential elements of the present disclosure.

1. First Embodiment 1-1. Oscillator Group

FIG. 1 is a diagram showing a configuration of an oscillator group 1 according to the present embodiment. The oscillator group 1 is constituted by a plurality of oscillators each having a resonator and an integrated circuit device housed in a container. The plurality of oscillators includes a first oscillator 2a and a second oscillator 2b. The first oscillator 2a is provided with a first resonator 5a, a first integrated circuit device 4a for oscillating the first resonator 5a, and a first container 3a for housing the first resonator 5a and the first integrated circuit device 4a. Further, the second oscillator 2b is provided with a second resonator 5b, a second integrated circuit device 4b for oscillating the second resonator 5b, and a second container 3b for housing the second resonator 5b and the second integrated circuit device 4b.

The first container 3a and the second container 3b are containers of the same type. Specifically, the first container 3a and the second container 3b are the same in shape of the container itself, and shapes, positions, the number, and so on of electrodes and wiring patterns provided to the container when ignoring manufacturing errors. For example, the first container 3a and the second container 3b can be ceramic packages the same in model number.

The first integrated circuit device 4a and the second integrated circuit device 4b are different in circuit configuration from each other, and thus, the first oscillator 2a and the second oscillator 2b are different in function from each other. In the present embodiment, the first integrated circuit device 4a includes a first oscillation circuit for oscillating the first resonator 5a to output a first oscillation signal, but does not include a PLL circuit. In contrast, the second integrated circuit device 4b includes a second oscillation circuit for oscillating the second resonator 5b to output a second oscillation signal, and the PLL circuit to which the second oscillation signal is input, and which outputs a third oscillation signal.

As described above, the oscillator group 1 is constituted by the plurality of oscillators each having the resonator and the integrated circuit device housed in the container of same type, and at the same time, different in function from each other. Further, the plurality of integrated circuit devices provided to the plurality of oscillators constituting the oscillator group 1 constitutes an integrated circuit device group, and the first integrated circuit device 4a and the second integrated circuit device 4b are included in the plurality of integrated circuit devices constituting the integrated circuit device group.

1-2. Functional Configuration of First Oscillator

FIG. 2 is a functional block diagram of the first oscillator 2a. As shown in FIG. 2, the first oscillator 2a includes the first resonator 5a and the first integrated circuit device 4a. The first integrated circuit device 4a has a VDD terminal, a VSS terminal, an OUT terminal, an OE terminal, an XI terminal, and an XO terminal as external coupling terminals. The VDD terminal, the VSS terminal, the OUT terminal, and the OE terminal are electrically coupled respectively to a VDD1 terminal, a VSS1 terminal, an OUT1 terminal, and an OE1 terminal as a plurality of external terminals of the first oscillator 2a. The XI terminal is electrically coupled to one end of the first resonator 5a, and the XO terminal is electrically coupled to the other end of the first resonator 5a.

In the present embodiment, the first integrated circuit device 4a includes a bias circuit 110, an oscillation circuit 120, a temperature compensation circuit 130, an output circuit 140, a logic circuit 150, and a nonvolatile memory 160. It should be noted that the first integrated circuit device 4a can be provided with a configuration obtained by eliminating or modifying some of these constituents, or adding other constituents.

The bias circuit 110 generates a power supply voltage Vreg as a constant voltage based on a power supply voltage VDD supplied from the outside via the VDD 1 terminal and the VDD terminal, and a ground voltage VSS supplied from the outside via the VSS1 terminal and the VSS terminal, and then supplies each circuit with the power supply voltage Vreg. Further, it is possible for the bias circuit 110 to generate a variety of reference voltages and then supply each circuit with the variety of reference voltages as needed.

FIG. 3 is a diagram showing a configuration example of the bias circuit 110. In the example shown in FIG. 3, the bias circuit 110 includes a bandgap reference circuit 111, an operational amplifier 112, a resistive element 113, a capacitive element 114, an N-channel MOS transistor 115, and resistive elements 116, 117.

The bandgap reference circuit 111 generates the reference voltage which is constant irrespective of the power supply voltage VDD and the temperature using a bandgap voltage of silicon.

The MOS transistor 115 and the resistive elements 116, 117 are coupled in series to each other between a node supplied with the power supply voltage VDD and a node supplied with the ground voltage VSS.

To a non-inverting input terminal of the operational amplifier 112, there is input the reference voltage output from the bandgap reference circuit 111, and to an inverting input terminal of the operational amplifier 112, there is input a voltage obtained by the resistive elements 116, 117 dividing the power supply voltage VDD. An output terminal of the operational amplifier 112 is coupled to the gate of the MOS transistor 115 via the resistive element 113.

The capacitive element 114 is coupled between the gate of the MOS transistor 115 and a node supplied with the ground voltage VSS, and the resistive element 113 and the capacitive element 114 constitute a filter for smoothing an output signal of the operational amplifier 112. Then, a voltage of the drain of the MOS transistor 115 is output as the power supply voltage Vreg.

Going back to the description of FIG. 2, the oscillation circuit 120 is electrically coupled to both ends of the first resonator 5a via the XI terminal and the XO terminal, and oscillates the first resonator 5a with a desired frequency to output an oscillation signal Vosc. Specifically, a signal output from the first resonator 5a is input to the oscillation circuit 120 via the XO terminal, and the oscillation circuit 120 amplifies that signal and then supplies the result to the first resonator 5a via the XI terminal.

Figure 4:
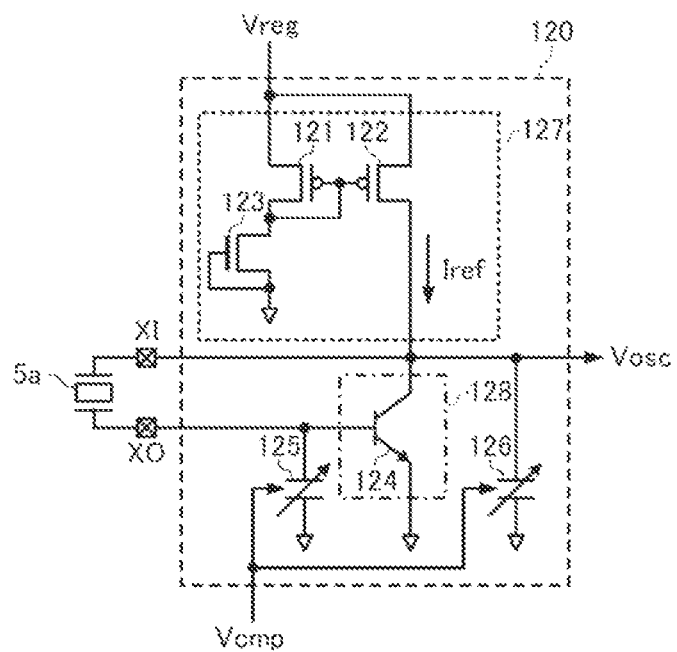
FIG. 4 is a diagram showing a configuration example of an oscillation circuit of the first oscillator.

FIG. 4 is a diagram showing a configuration example of the oscillation circuit 120. In the example shown in FIG. 4, the oscillation circuit 120 includes P-channel MOS transistors 121, 122, an N-channel MOS transistor 123, an NPN bipolar transistor 124, and variable-capacitance elements 125, 126. The MOS transistors 121, 122 are each of an enhancement type, and the MOS transistor 123 is of a depression type.

The gate of the MOS transistor 121 is electrically coupled to the drain of the MOS transistor 121, the gate of the MOS transistor 122, and the drain of the MOS transistor 123. The source of the MOS transistor 121 and the source of the MOS transistor 122 are supplied with the power supply voltage Vreg. the gate and the source of the MOS transistor 123 are grounded, and are supplied with the ground voltage VSS. The drain of the MOS transistor 122 is electrically coupled to the collector of the bipolar transistor 124, one end of the variable-capacitance element 126, and the XI terminal. The base of the bipolar transistor 124 is electrically coupled to one end of the variable-capacitance element 125 and the XO terminal. The emitter of the bipolar transistor 124, the other end of the variable-capacitance element 125, and the other end of the variable-capacitance element 126 are grounded, and are supplied with the ground voltage VSS. The capacitance values of the variable-capacitance elements 125, 126 vary in accordance with a voltage of a temperature compensation signal Vcmp.

In the oscillation circuit 120 configured in such a manner, a constant current Iref flows through the drain of the MOS transistor 122, and the bipolar transistor 124 is supplied with the current Iref to perform an amplification operation. Then, a signal of the collector of the bipolar transistor 124 is output as the oscillation signal Vosc. In other words, the bipolar transistor 124 constitutes an amplifier circuit 128 which amplifies a signal from the first resonator 5a to output the oscillation signal Vosc. Further, the MOS transistors 121, 122, and 123 constitute a current source 127 for supplying the amplifier circuit 128 with the current Iref. Further, the variable-capacitance elements 125, 126 each function as a load capacitance for the first resonator 5a, and a frequency of the oscillation signal Vosc becomes a frequency corresponding to the capacitance values of the variable-capacitance elements 125, 126.

Going back to the description of FIG. 2, it is possible for the first integrated circuit device 4a to be able to set whether to make the temperature compensation circuit 130 operate. When the temperature compensation function is set valid in accordance with a temperature compensation function setting bit cmpEN, the temperature compensation circuit 130 generates the temperature compensation signal Vcmp for compensating the frequency-temperature characteristic of the oscillation signal Vosc output from the oscillation circuit 120 based on a temperature compensation data cmpDT corresponding to the frequency-temperature characteristic of the first resonator 5a, and then outputs the temperature compensation signal Vcmp to the oscillation circuit 120. The temperature compensation data cmpDT includes, for example, coefficient values of respective orders of a temperature compensation function for compensating the frequency-temperature characteristic of the first resonator 5a. Further, when the temperature compensation function is set invalid in accordance with the temperature compensation function setting bit cmpEN, the temperature compensation circuit 130 stops the operation, and thus the current consumption is reduced. The temperature compensation data cmpDT is generated in a manufacturing process of the first oscillator 2a, and is written into the nonvolatile memory 160 together with the temperature compensation function setting bit cmpEN. When the first oscillator 2a is in operation, the temperature compensation function setting bit cmpEN and the temperature compensation data cmpDT stored in the nonvolatile memory 160 are supplied to the temperature compensation circuit 130 via the logic circuit 150.

Figure 5:
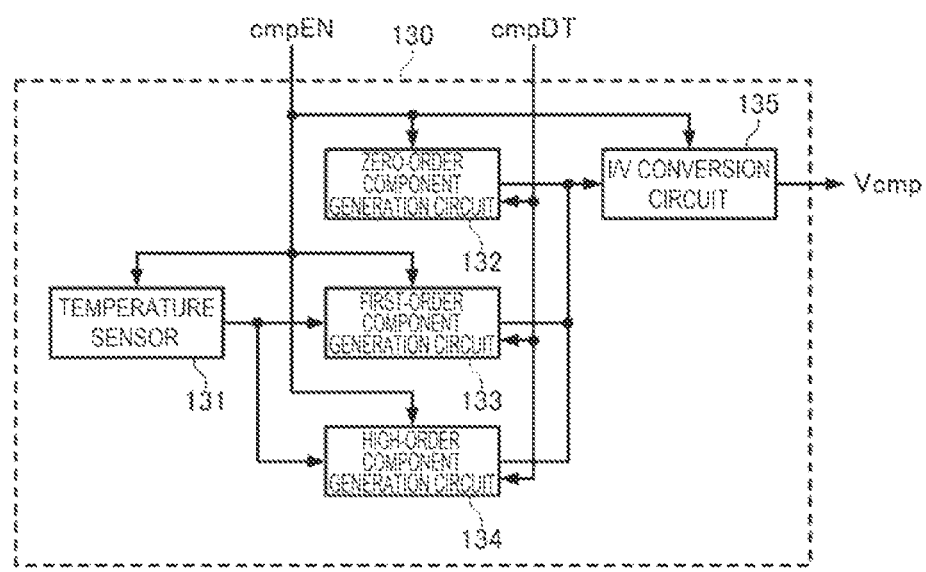
FIG. 5 is a diagram showing a configuration example of a temperature compensation circuit of the first oscillator.

FIG. 5 is a diagram showing a configuration example of the temperature compensation circuit 130. In the example shown in FIG. 5, the temperature compensation circuit 130 includes a temperature sensor 131, a zero-order component generation circuit 132, a first-order component generation circuit 133, a high-order component generation circuit 134, and an I/V conversion circuit 135.

The temperature sensor 131, the zero-order component generation circuit 132, the first-order component generation circuit 133, the high-order component generation circuit 134, and the I/V conversion circuit 135 operate when the temperature compensation function is set valid in accordance with the temperature compensation function setting bit cmpEN, or stops operating when the temperature compensation function is set invalid in accordance with the temperature compensation function setting bit cmpEN.

The temperature sensor 131 is a device for detecting the temperature of the first integrated circuit device 4a to output a temperature signal having a voltage corresponding to the temperature, and is realized by, for example, a circuit using a temperature characteristic of the bandgap reference circuit.

The zero-order component generation circuit 132 outputs a current signal corresponding to a zero-order term of the temperature compensation function based on the zero-order coefficient value included in the temperature compensation data cmpDT.

The first-order component generation circuit 133 outputs a current signal corresponding to a first-order term of the temperature compensation function based on the temperature signal output from the temperature sensor 131 and the first-order coefficient value included in the temperature compensation data cmpDT.

The high-order component generation circuit 134 outputs a current signal corresponding to each of a second-order term and higher-order terms of the temperature compensation function based on the temperature signal output from the temperature sensor 131 and each of a second-order coefficient value and higher-order coefficient values included in the temperature compensation data cmpDT. For example, the high-order component generation circuit 134 outputs current signals corresponding respectively to the second-order term through a seventh-order term of the temperature compensation function.

The I/V conversion circuit 135 converts a current signal into a voltage signal, wherein the current signal is obtained by adding the current signal output from the zero-order component generation circuit 132, the current signal output from the first-order component generation circuit 133, and the current signals output from the high-order component generation circuit 134 to each other. This voltage signal is output as the temperature compensation signal Vcmp.

Due to the temperature compensation signal Vcmp, the oscillation signal Vosc output by the oscillation circuit 120 becomes substantially constant in frequency at an arbitrary temperature included in a predetermined temperature range.

Going back to the description of FIG. 2, the oscillation signal Vosc is input to the output circuit 140. The output circuit 140 outputs the oscillation signal Vout based on the oscillation signal Vosc when an output enable signal outEN supplied from the logic circuit 150 is at a high level, and outputs a signal at the ground voltage VSS or high impedance when the output enable signal outEN is at a low level. For example, it is possible for the output circuit 140 to output the oscillation signal Vout obtained by dividing the oscillation signal Vosc at a frequency division ratio set by output setting data outDT. Further, it is possible for the output circuit 140 to output the oscillation signal Vout of an output type set by the output setting data outDT. The output type of the oscillation signal Vout can be, for example, CMOS output or clipped-sine output. CMOS is an abbreviation for Complementary Metal Oxide Semiconductor. Further, it is possible for the output circuit 140 to output the oscillation signal Vout of an output capacity set by the output setting data outDT. The output setting data outDT is written into the nonvolatile memory 160 in the manufacturing process of the first oscillator 2a. When the first oscillator 2a is in operation, the output setting data outDT stored in the nonvolatile memory 160 is supplied to the output circuit 140 via the logic circuit 150.

Figure 6:
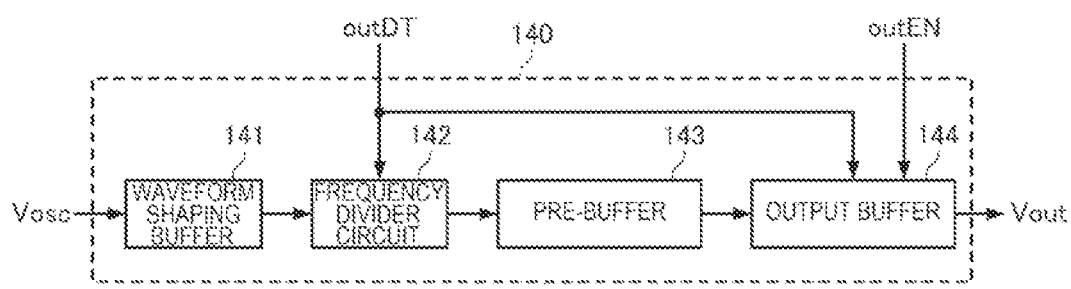
FIG. 6 is a diagram showing a configuration example of an output circuit.

FIG. 6 is a diagram showing a configuration example of the output circuit 140. In the example shown in FIG. 6, the output circuit 140 includes a waveform shaping buffer 141, a frequency divider circuit 142, a pre-buffer 143, and an output buffer 144.

The waveform shaping buffer 141 buffers the oscillation signal Vosc output from the oscillation circuit 120 to output an oscillation signal shaped like a rectangular wave.

The frequency divider circuit 142 outputs an oscillation signal obtained by dividing the oscillation signal output from the waveform shaping buffer 141 at the frequency division ratio set by the output setting data outDT. It should be noted that when the frequency division ratio is 1, the frequency divider circuit 142 outputs the oscillation signal obtained by buffering the oscillation signal output from the waveform shaping buffer 141. The oscillation signal output from the frequency divider circuit 142 is input to the pre-buffer 143.

The pre-buffer 143 outputs the oscillation signal obtained by buffering the oscillation signal output from the frequency divider circuit 142. The pre-buffer 143 also functions as a level shifter for outputting the oscillation signal at a voltage level matched to an input voltage level of the output buffer 144.

The output buffer 144 converts the oscillation signal output from the pre-buffer 143 into the oscillation signal Vout of the output type and the output capacity set by the output setting data outDT. Then, the output buffer 144 outputs the oscillation signal Vout when the output enable signal outEN is at the high level, and outputs the signal at the ground voltage VSS when the output enable signal outEN is at the low level.

Going back to the description of FIG. 2, the logic circuit 150 controls the operation of each of the circuits. Specifically, the logic circuit 150 sets an operation mode of the first oscillator 2a or the first integrated circuit device 4a to one of a plurality of modes including an external communication mode and a normal operation mode based on a control signal input to a predetermined external coupling terminal of the first integrated circuit device 4a, and performs control corresponding to the operation mode thus set. In the present embodiment, when the control signal having a predetermined pattern is input from the OE terminal within a predetermined period from when the supply of the power supply voltage VDD to the VDD terminal starts, the logic circuit 150 sets the operation mode to the external communication mode after the predetermined period elapses. For example, it is possible for the logic circuit 150 to assume a period until it is detected that the first resonator 5a starts the oscillation due to the supply of the power supply voltage VDD and then the oscillation stabilizes as the predetermined period, or it is possible for the logic circuit 150 to count the number of pulses of the oscillation signal Vosc, and then determine that the predetermined period has elapsed when the count value has reached a predetermined value. Further, for example, it is possible for the logic circuit 150 to measure the predetermined period based on an output signal of an RC time-constant circuit which starts to operate due to the supply of the power supply voltage VDD.

In the external communication mode, it is possible for the logic circuit 150 to perform data communication with an external device not shown coupled to the OE1 terminal and the OUT1 terminal via the OE terminal and the OUT terminal. The external device outputs a serial clock signal to the OUT1 terminal in accordance with a predetermined communication standard, outputs serial data signal to the OE1 terminal or obtains a signal output to the OE1 terminal via the OE terminal from the logic circuit 150 in sync with the serial clock signal. In the external communication mode, the logic circuit 150 samples the serial data signal as a variety of commands at every edge of the serial clock signal according to the standard of, for example, an I$^2$C bus. I$^2$C is an abbreviation for Inter-Integrated Circuit. Then, the logic circuit 150 performs processing such as setting of the operation mode, and writing and reading of data to and from the nonvolatile memory 160 based on the command thus sampled. It should be noted that the logic circuit 150 performs the communication with the external device in accordance with the communication standard of a two-wire bus such as the I$^2$C bus in the present embodiment, but can perform the communication with the external device in accordance with a communication standard of a three-wire bus or a four-wire bus such as an SPI bus. SPI is an abbreviation for Serial Peripheral Interface.

Figure 7:
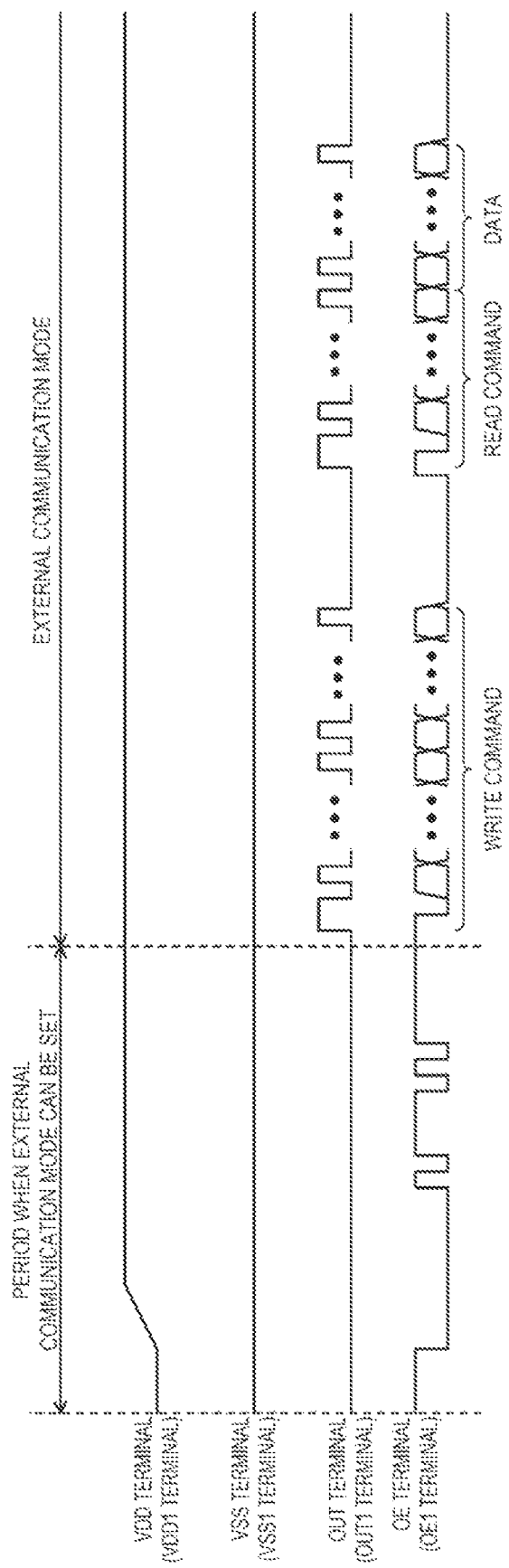
FIG. 7 is a diagram showing an example of a timing chart of writing and reading data to and from a nonvolatile memory.

For example, when the logic circuit 150 samples a write command to the nonvolatile memory 160 in the external communication mode, the logic circuit 150 writes data designated by the write command at the address in the nonvolatile memory 160 designated by the write command. Further, when the logic circuit 150 samples a read command to the nonvolatile memory 160 in the external communication mode, the logic circuit 150 reads out data from the address in the nonvolatile memory 160 designated by the read command, then converts the data into the serial data, and then outputs the serial data. FIG. 7 shows an example of a timing chart when the transition to the external communication mode is made after the supply of the power supply voltage VDD to the VDD terminal starts, and then the writing and the reading of the data to and from the nonvolatile memory 160 are performed in the external communication mode.

Further, for example, when the logic circuit 150 has sampled a normal operation mode setting command in the external communication mode, the logic circuit 150 makes the transition of the operation mode from the external communication mode to the normal operation mode. In the normal operation mode, the logic circuit 150 supplies the output circuit 140 with a signal input from the outside of the first oscillator 2a via the OE1 terminal and the OE terminal as the output enable signal outEN. Therefore, in the normal operation mode, the output of the oscillation signal Vout from the OUT1 terminal is controlled based on a signal input to the OE1 terminal.

It should be noted that when a signal having a predetermined pattern is not input from the OE terminal within a predetermined period from when the supply of the power supply voltage VDD starts, the logic circuit 150 sets the operation mode directly to the normal operation mode after the predetermined period elapses without setting the operation mode to the external communication mode.

The nonvolatile memory 160 is a memory for storing a variety of types of information, and is, for example, an MONOS memory or an EEPROM. MONOS is an abbreviation for Metal Oxide Nitride Oxide Silicon, and EEPROM is an abbreviation for Electrically Erasable Programmable Read-Only Memory. In the manufacturing process of the first oscillator 2a, a variety of types of information for controlling the circuits such as the temperature compensation function setting bit cmpEN, the temperature compensation data cmpDT, and the output setting data outDT are stored in the nonvolatile memory 160. Then, when the power is applied to the first oscillator 2a, the variety of types of information stored in the nonvolatile memory 160 are transferred to a register not shown provided to the logic circuit 150, and the variety of types of information stored in the register are arbitrarily supplied to the respective circuits.

It should be noted that the oscillation circuit 120 is an example of the "first oscillation circuit," and the oscillation signal Vosc output from the oscillation circuit 120 is an example of the "first oscillation signal." Further, the amplifier circuit 128 is an example of a "first amplifier circuit," the current source 127 is an example of a "first current source," the MOS transistor 122 is an example of a "first transistor," and a current Iref supplied to the amplifier circuit 128 by the MOS transistor 122 is an example of a "first current." Further, the temperature compensation circuit 130 is an example of a "first temperature compensation circuit," and the temperature compensation signal Vcmp output from the temperature compensation circuit 130 is an example of a "first temperature compensation signal."

1-3. Functional Configuration of Second Oscillator

Figure 8:
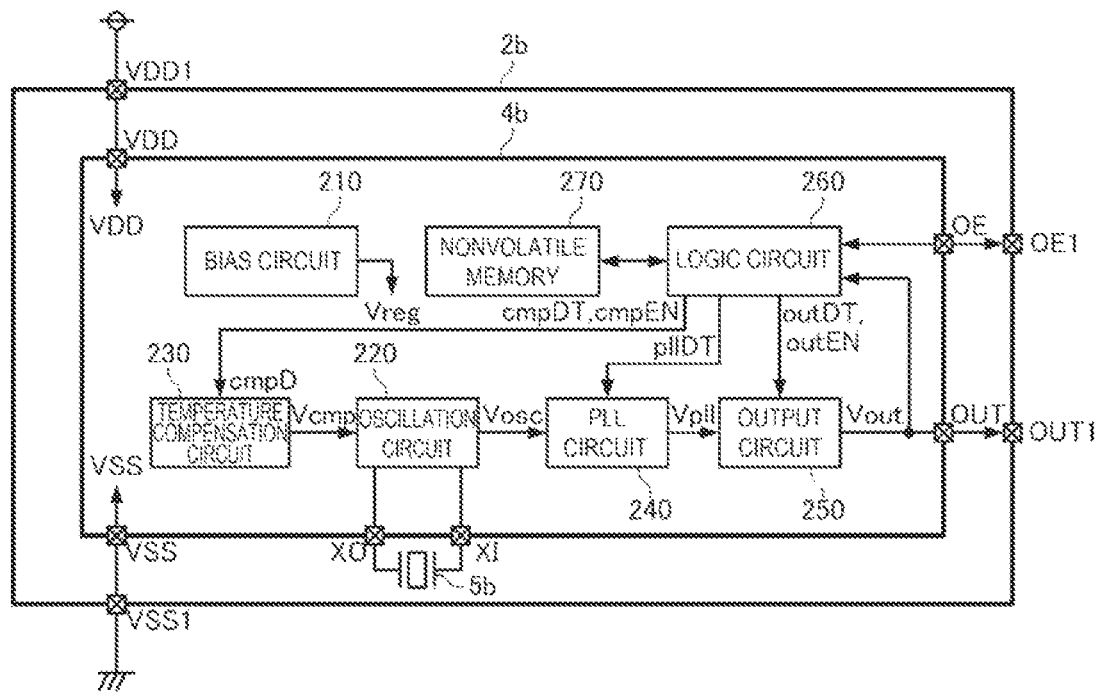
FIG. 8 is a functional block diagram of a second oscillator.

FIG. 8 is a functional block diagram of the second oscillator 2b. As shown in FIG. 8, the second oscillator 2b includes the second resonator 5b and the second integrated circuit device 4b. Similarly to the first integrated circuit device 4a, the second integrated circuit device 4b has a VDD terminal, a VSS terminal, an OUT terminal, an OE terminal, an XI terminal, and an XO terminal as external coupling terminals. The VDD terminal, the VSS terminal, the OUT terminal, and the OE terminal are electrically coupled respectively to a VDD1 terminal, a VSS1 terminal, an OUT1 terminal, and an OE1 terminal as a plurality of external terminals of the second oscillator 2b. The XI terminal is electrically coupled to one end of the second resonator 5b, and the XO terminal is electrically coupled to the other end of the second resonator 5b.

In the present embodiment, the second integrated circuit device 4b includes a bias circuit 210, an oscillation circuit 220, a temperature compensation circuit 230, a PLL circuit 240, an output circuit 250, a logic circuit 260, and a nonvolatile memory 270. It should be noted that the second integrated circuit device 4b can be provided with a configuration obtained by eliminating or modifying some of these constituents, or adding other constituents.

The bias circuit 210 generates a power supply voltage Vreg as a constant voltage based on a power supply voltage VDD supplied from the outside via the VDD 1 terminal and the VDD terminal, and a ground voltage VSS supplied from the outside via the VSS1 terminal and the VSS terminal, and then supplies each circuit with the power supply voltage Vreg. Further, the bias circuit 210 generates a variety of reference voltages, and then supplies each circuit with the variety of reference voltages as needed. The configuration example of the bias circuit 210 is substantially the same as shown in FIG. 3, and therefore, the illustration and the description thereof will be omitted.

The oscillation circuit 220 is electrically coupled to both ends of the second resonator 5b via the XI terminal and the XO terminal, and oscillates the second resonator 5b with a desired frequency to output an oscillation signal Vosc. Specifically, a signal output from the second resonator 5b is input to the oscillation circuit 220 via the XO terminal, and the oscillation circuit 220 amplifies that signal and then supplies the result to the second resonator 5b via the XI terminal.

Figure 9:
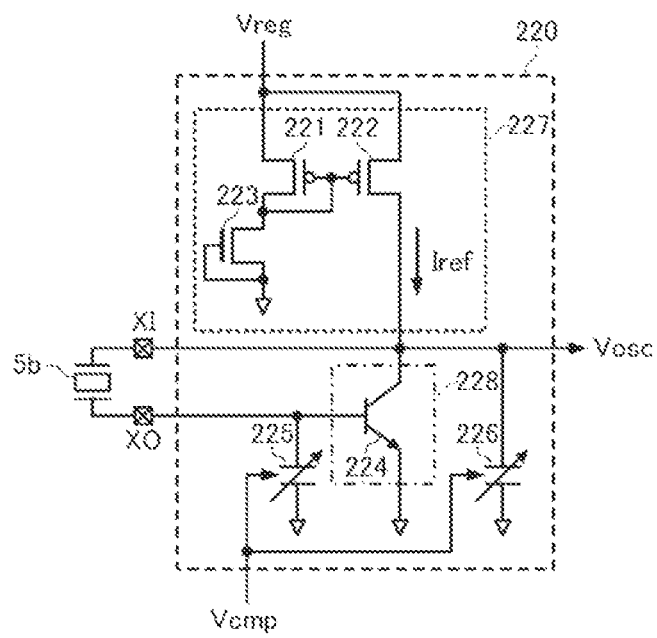
FIG. 9 is a diagram showing a configuration example of an oscillation circuit of the second oscillator.

FIG. 9 is a diagram showing a configuration example of the oscillation circuit 220. In the example shown in FIG. 9, the oscillation circuit 220 includes P-channel MOS transistors 221, 222, an N-channel MOS transistor 223, an NPN bipolar transistor 224, and variable-capacitance elements 225, 226. The MOS transistors 221, 222 are each of the enhancement type, and the MOS transistor 223 is of the depression type.

The gate of the MOS transistor 221 is electrically coupled to the drain of the MOS transistor 221, the gate of the MOS transistor 222, and the drain of the MOS transistor 223. The source of the MOS transistor 221 and the source of the MOS transistor 222 are supplied with the power supply voltage Vreg. The gate and the source of the MOS transistor 223 are grounded, and are supplied with the ground voltage VSS. The drain of the MOS transistor 222 is electrically coupled to the collector of the bipolar transistor 224, one end of the variable-capacitance element 226, and the XI terminal. The base of the bipolar transistor 224 is electrically coupled to one end of the variable-capacitance element 225 and the XO terminal. The emitter of the bipolar transistor 224, the other end of the variable-capacitance element 225, and the other end of the variable-capacitance element 226 are grounded, and are supplied with the ground voltage VSS. The capacitance values of the variable-capacitance elements 225, 226 vary in accordance with a voltage of a temperature compensation signal Vcmp.

In the oscillation circuit 220 configured in such a manner, a constant current Iref flows through the drain of the MOS transistor 222, and the bipolar transistor 224 is supplied with the current Iref to perform an amplification operation. Then, a signal of the collector of the bipolar transistor 224 is output as the oscillation signal Vosc. In other words, the bipolar transistor 224 constitutes an amplifier circuit 228 which amplifies a signal from the second resonator 5b to output the oscillation signal Vosc. Further, the MOS transistors 221, 222, and 223 constitute a current source 227 for supplying the amplifier circuit 228 with the current Iref. Further, the variable-capacitance elements 225, 226 each function as a load capacitance for the second resonator 5*b*, and a frequency of the oscillation signal Vosc becomes a frequency corresponding to the capacitance values of the variable-capacitance elements 225, 226.

Going back to the description of FIG. 8, when the temperature compensation function is set valid in accordance with the temperature compensation function setting bit cmpEN, the temperature compensation circuit 230 generates the temperature compensation signal Vcmp for compensating the frequency-temperature characteristic of the oscillation signal Vosc output from the oscillation circuit 220 based on the temperature compensation data cmpDT corresponding to the frequency-temperature characteristic of the second resonator 5*b*, and then outputs the temperature compensation signal Vcmp to the oscillation circuit 220. The temperature compensation data cmpDT includes, for example, coefficient values of respective orders of a temperature compensation function for compensating the frequency-temperature characteristic of the second resonator 5*b*. Further, when the temperature compensation function is set invalid in accordance with the temperature compensation function setting bit cmpEN, the temperature compensation circuit 230 stops the operation, and thus the current consumption is reduced. The temperature compensation data cmpDT is generated in a manufacturing process of the second oscillator 2*b*, and is written into the nonvolatile memory 270 together with the temperature compensation function setting bit cmpEN. When the second oscillator 2*b* is in operation, the temperature compensation function setting bit cmpEN and the temperature compensation data cmpDT stored in the nonvolatile memory 270 are supplied to the temperature compensation circuit 230 via the logic circuit 260.

Figure 10:
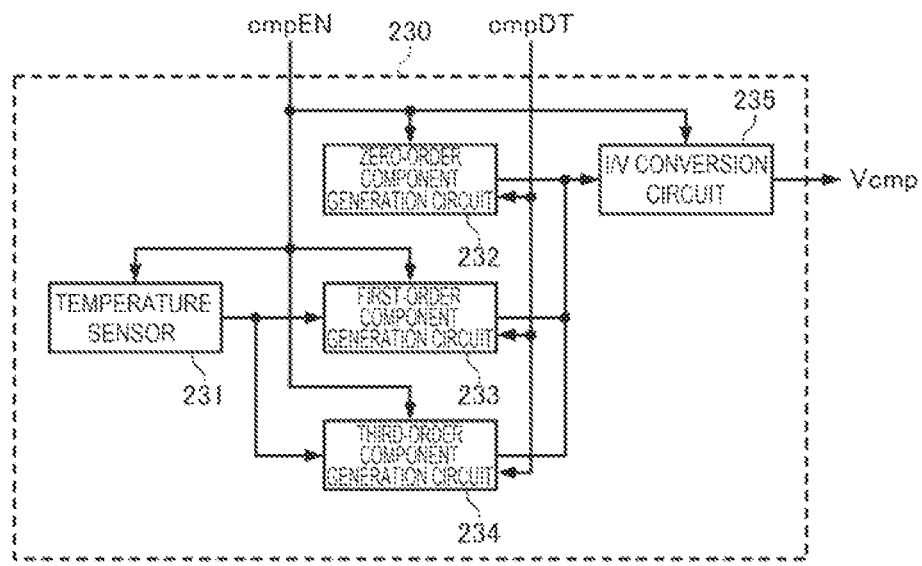
FIG. 10 is a diagram showing a configuration example of a temperature compensation circuit of the second oscillator.

FIG. 10 is a diagram showing a configuration example of the temperature compensation circuit 230. In the example shown in FIG. 10, the temperature compensation circuit 230 includes a temperature sensor 231, a zero-order component generation circuit 232, a first-order component generation circuit 233, a third-order component generation circuit 234, and an I/V conversion circuit 235.

The temperature sensor 231, the zero-order component generation circuit 232, the first-order component generation circuit 233, the third-order component generation circuit 234, and the I/V conversion circuit 235 operate when the temperature compensation function is set valid in accordance with the temperature compensation function setting bit cmpEN, or stops operating when the temperature compensation function is set invalid in accordance with the temperature compensation function setting bit cmpEN.

The temperature sensor 231 is a device for detecting the temperature of the second integrated circuit device 4*b* to output a temperature signal having a voltage corresponding to the temperature, and is realized by, for example, a circuit using a temperature characteristic of the bandgap reference circuit.

The zero-order component generation circuit 232 outputs a current signal corresponding to a zero-order term of the temperature compensation function based on the zero-order coefficient value included in the temperature compensation data cmpDT.

The first-order component generation circuit 233 outputs a current signal corresponding to a first-order term of the temperature compensation function based on the temperature signal output from the temperature sensor 231 and the first-order coefficient value included in the temperature compensation data cmpDT.

The third-order component generation circuit 234 outputs a current signal corresponding to a third-order term of the temperature compensation function based on the temperature signal output from the temperature sensor 231 and the third-order coefficient value included in the temperature compensation data cmpDT.

The I/V conversion circuit 235 converts a current signal into a voltage signal, wherein the current signal is obtained by adding the current signal output from the zero-order component generation circuit 232, the current signal output from the first-order component generation circuit 233, and the current signal output from the third-order component generation circuit 234 to each other. This voltage signal is output as the temperature compensation signal Vcmp.

Due to the temperature compensation signal Vcmp, the oscillation signal Vosc output by the oscillation circuit 220 becomes substantially constant in frequency at an arbitrary temperature included in a predetermined temperature range.

Going back to the description of FIG. 8, the oscillation signal Vosc is input to the PLL circuit 240, and the PLL circuit 240 outputs an oscillation signal Vpll. The PLL circuit 240 generates the oscillation signal Vpll by performing feedback control so that the phase of the oscillation signal Vosc coincides with a phase of a signal obtained by dividing a frequency of the oscillation signal Vpll at a frequency division ratio set by PLL setting data pllDT. Further, the PLL circuit 240 can operate with an integer PLL method or a fractional PLL method in accordance with a PLL method set by the PLL setting data pllDT, wherein the frequency of the oscillation signal Vpll is divided at an integer frequency division ratio in the integer PLL method, and the frequency of the oscillation signal Vpll is divided at a fractional frequency division ratio in the fractional PLL method. In other words, it is possible for the second integrated circuit device 4*b* to be able to set the operation of the PLL circuit 240 to the integer PLL method or the fractional PLL method. The PLL setting data pllDT is written into the nonvolatile memory 270 in the manufacturing process of the second oscillator 2*b*. When the second oscillator 2*b* is in operation, the PLL setting data pllDT stored in the nonvolatile memory 270 is supplied to the PLL circuit 240 via the logic circuit 260.

Figure 11:
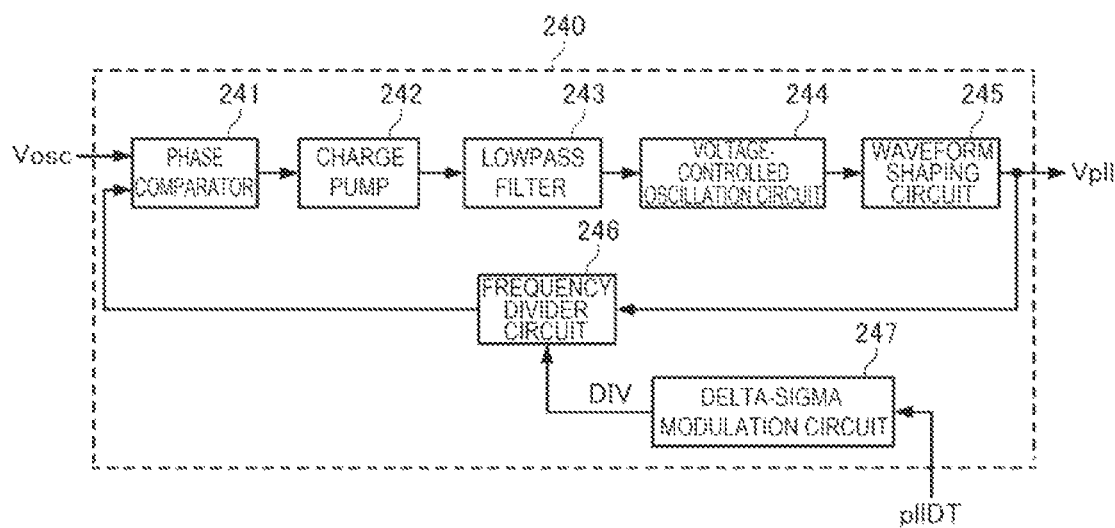
FIG. 11 is a diagram showing a configuration example of a PLL circuit.

FIG. 11 is a diagram showing a configuration example of the PLL circuit 240. In the example shown in FIG. 11, the PLL circuit 240 includes a phase comparator 241, a charge pump 242, a lowpass filter 243, a voltage-controlled oscillation circuit 244, a waveform shaping circuit 245, a frequency divider circuit 246, and a delta-sigma modulation circuit 247.

The phase comparator 241 compares a phase of the oscillation signal Vosc output from the oscillation circuit 220 and a phase of a signal output from the frequency divider circuit 246 with each other, and then outputs the comparison result as a pulse voltage.

The charge pump 242 converts the pulse voltage output by the phase comparator 241 into a current, and the lowpass filter 243 smoothens the current thus output by the charge pump 242, and then performs a voltage conversion on the current thus smoothed.

The voltage-controlled oscillation circuit 244 outputs the oscillation signal varying in frequency in accordance with a control voltage using an output voltage of the lowpass filter 243 as the control voltage. The voltage-controlled oscillation circuit 244 can be realized as a variety of types of oscillation circuits such as an LC oscillation circuit configured using an inductance element such as a coil and a capacitive element such as a capacitor, and an oscillation circuit using a piezoelectric resonator such as a quartz crystal resonator.

The waveform shaping circuit 245 buffers the oscillation signal output from the voltage-controlled oscillation circuit 244 to output the oscillation signal Vpll shaped like a rectangular wave.

The frequency divider circuit 246 outputs a signal obtained by dividing the frequency of the oscillation signal Vpll output from the waveform shaping circuit 245 taking a value of a frequency division ratio setting signal DIV output from the delta-sigma modulation circuit 247 as the frequency division ratio.

The delta-sigma modulation circuit 247 outputs the frequency division ratio setting signal DIV for setting the frequency division ratio of the frequency divider circuit 246 in accordance with a frequency division ratio N·f set by the PLL setting data pllDT. Specifically, when the fractional PLL method is set in the PLL setting data pllDT, the delta-sigma modulation circuit 247 operates, and the value of the frequency division ratio setting signal DIV is sequentially switched to any one of the integral values different from each other so that a time mean value of the frequency division ratio setting signal DIV coincides with the frequency division ratio N·f set by the PLL setting data pllDT. Therefore, in a steady state in which the phase of the oscillation signal Vosc and the phase of the signal output from the frequency divider circuit 246 are in sync with each other, a relationship in the following formula (1) becomes true between a frequency $f_{osc}$ of the oscillation signal Vosc and a frequency $f_{pll}$ of the oscillation signal Vpll.

$$f_{pll}=N \cdot f \times f_{osc} \quad (1)$$

In contrast, when the integer PLL method is set in the PLL setting data pllDT, the delta-sigma modulation circuit 247 stops operating, and the value of the frequency division ratio setting signal DIV is fixed to the integer frequency division ratio N out of the frequency division ratio N·f set by the PLL setting data pllDT. Therefore, in the steady state in which the phase of the oscillation signal Vosc and the phase of the signal output from the frequency divider circuit 246 are in sync with each other, a relationship in the following formula (2) becomes true between the frequency $f_{osc}$ of the oscillation signal Vosc and the frequency $f_{pll}$ of the oscillation signal Vpll.

$$f_{pll}=N \times f_{osc} \quad (2)$$

For example, the frequency $f_{osc}$ can be in a range of several MHz through several tens MHz, and the frequency $f_{pll}$ can be in a range of several hundreds MHz through several GHz.

Going back to the description of FIG. 8, the oscillation signal Vpll is input to the output circuit 250. The output circuit 250 outputs the oscillation signal Vout based on the oscillation signal Vpll when the output enable signal outEN supplied from the logic circuit 260 is at the high level, and outputs a signal at the ground voltage VSS when the output enable signal outEN is at the low level. For example, it is possible for the output circuit 250 to output the oscillation signal Vout obtained by dividing the frequency of the oscillation signal Vpll at the frequency division ratio set by the output setting data outDT. Further, it is possible for the output circuit 250 to output the oscillation signal Vout of the output type set by the output setting data outDT. The output type of the oscillation signal Vout can be, for example, CMOS output or clipped-sine output. Further, it is possible for the output circuit 250 to output the oscillation signal Vout of an output capacity set by the output setting data outDT. The output setting data outDT is written into the nonvolatile memory 270 in the manufacturing process of the second oscillator 2b. When the second oscillator 2b is in operation, the output setting data outDT stored in the nonvolatile memory 270 is supplied to the output circuit 250 via the logic circuit 260. Since the output circuit 250 is the same as shown in FIG. 6, the illustration and the description thereof are omitted.

The logic circuit 260 controls an operation of each of the circuits. Specifically, the logic circuit 260 sets an operation mode of the second oscillator 2b or the second integrated circuit device 4b to one of a plurality of modes including an external communication mode and a normal operation mode based on a control signal input to a predetermined external coupling terminal of the second integrated circuit device 4b, and performs control corresponding to the operation mode thus set. In the present embodiment, when the control signal having a predetermined pattern is input from the OE terminal within a predetermined period from when the supply of the power supply voltage VDD to the VDD terminal starts, the logic circuit 260 sets the operation mode to the external communication mode after the predetermined period elapses. For example, it is possible for the logic circuit 260 to assume a period until it is detected that the second resonator 5b starts the oscillation due to the supply of the power supply voltage VDD and then the oscillation stabilizes as the predetermined period, or it is possible for the logic circuit 260 to count the number of pulses of the oscillation signal Vosc, and then determine that the predetermined period has elapsed when the count value has reached a predetermined value. Further, for example, it is possible for the logic circuit 260 to measure the predetermined period based on an output signal of an RC time-constant circuit which starts to operate due to the supply of the power supply voltage VDD.

In the external communication mode, it is possible for the logic circuit 260 to perform data communication with an external device not shown coupled to the OE1 terminal and the OUT1 terminal via the OE terminal and the OUT terminal. The external device outputs a serial clock signal to the OUT1 terminal in accordance with a predetermined communication standard, outputs serial data signal to the OE1 terminal or obtains a signal output to the OE1 terminal via the OE terminal from the logic circuit 260 in sync with the serial clock signal. In the external communication mode, the logic circuit 260 samples the serial data signal as a variety of commands at every edge of the serial clock signal according to the standard of, for example, the I²C bus. Then, the logic circuit 260 performs processing such as setting of the operation mode, and writing and reading of data to and from the nonvolatile memory 270 based on the command thus sampled. It should be noted that the logic circuit 260 performs the communication with the external device in accordance with the communication standard of a two-wire bus such as the I²C bus in the present embodiment, but can perform the communication with the external device in accordance with a communication standard of a three-wire bus or a four-wire bus such as an SPI bus.

For example, when the logic circuit 260 samples the write command to the nonvolatile memory 270 in the external communication mode, the logic circuit 260 writes data designated by the write command at the address in the nonvolatile memory 270 designated by the write command. Further, when the logic circuit 260 samples the read command to the nonvolatile memory 270 in the external communication mode, the logic circuit 260 reads out data from the address in the nonvolatile memory 270 designated by the read command, then converts the data into the serial data, and then outputs the serial data. An example of a timing chart when the writing and the reading of data to and from the nonvolatile memory 270 are performed is substantially the same as shown in FIG. 7.

Further, for example, when the logic circuit 260 has sampled a normal operation mode setting command in the external communication mode, the logic circuit 260 makes the transition of the operation mode from the external communication mode to the normal operation mode. In the normal operation mode, the logic circuit 260 supplies the output circuit 250 with a signal input from the outside of the second oscillator 2b via the OE1 terminal and the OE terminal as the output enable signal outEN. Therefore, in the normal operation mode, the output of the oscillation signal Vout from the OUT1 terminal is controlled based on a control signal input to the OE1 terminal.

It should be noted that when a signal having a predetermined pattern is not input from the OE terminal within a predetermined period from when the supply of the power supply voltage VDD starts, the logic circuit 260 sets the operation mode directly to the normal operation mode after the predetermined period elapses without setting the operation mode to the external communication mode.

The nonvolatile memory 270 is a memory for storing a variety of types of information, and is, for example, an MONOS memory or an EEPROM. In the manufacturing process of the second oscillator 2b, a variety of types of information for controlling the circuits such as the temperature compensation function setting bit cmpEN, the temperature compensation data cmpDT, the PLL setting data pllDT, and the output setting data outDT are stored in the nonvolatile memory 270. Then, when the power is applied to the second oscillator 2b, the variety of types of information stored in the nonvolatile memory 270 are transferred to a register not shown provided to the logic circuit 260, and the variety of types of information stored in the register are arbitrarily supplied to the respective circuits.

It should be noted that the oscillation circuit 220 is an example of the "second oscillation circuit," and the oscillation signal Vosc output from the oscillation circuit 220 is an example of the "second oscillation signal." Further, the oscillation signal Vpll output from the PLL circuit 240 is an example of the "third oscillation signal." Further, the amplifier circuit 228 is an example of a "second amplifier circuit," the current source 227 is an example of a "second current source," the MOS transistor 222 is an example of a "second transistor," and a current Iref supplied to the amplifier circuit 228 by the MOS transistor 222 is an example of a "second current." Further, the temperature compensation circuit 230 is an example of a "second temperature compensation circuit," and the temperature compensation signal Vcmp output from the temperature compensation circuit 230 is an example of a "second temperature compensation signal."

Figure 12:
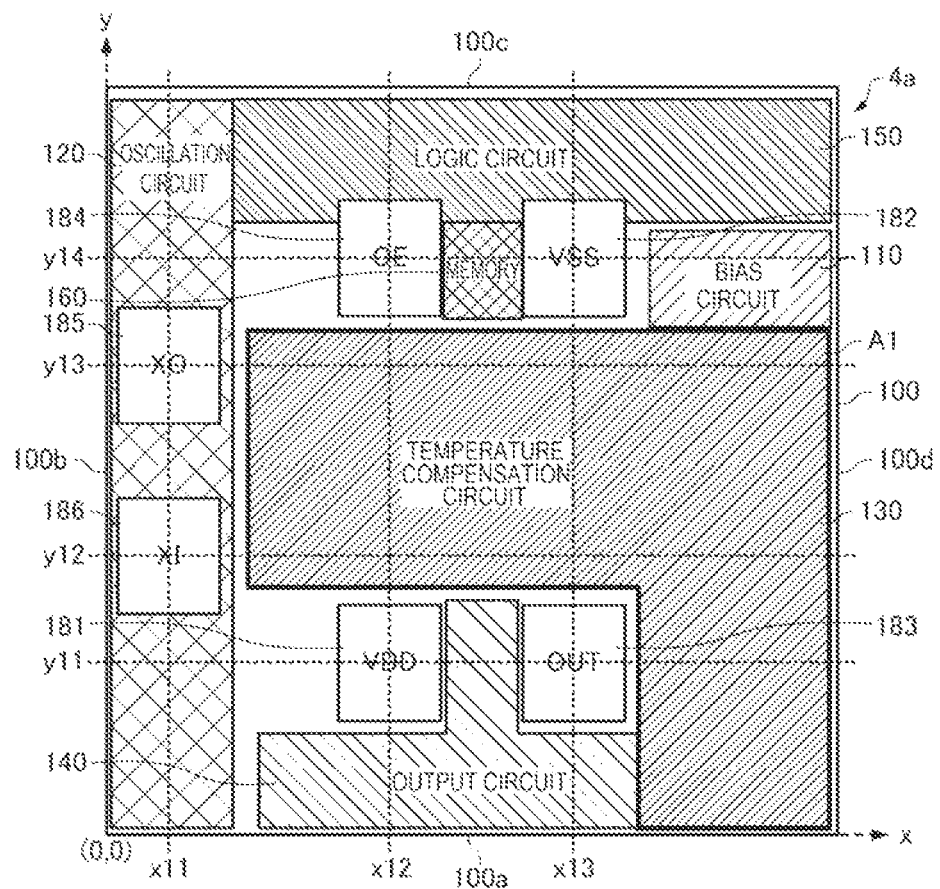
FIG. 12 is a diagram showing an example of a layout arrangement of a first integrated circuit device.

1-4. Layout Arrangement of First Integrated Circuit Device and Second Integrated Circuit Device FIG. 12 is a diagram showing an example of a layout arrangement of the first integrated circuit device 4a. In the example shown in FIG. 12, the first integrated circuit device 4a has a semiconductor substrate 100 shaped like a rectangle having four sides 100a, 100b, 100c, and 100d in a plan view. The bias circuit 110, the oscillation circuit 120, the temperature compensation circuit 130, the output circuit 140, the logic circuit 150, and the nonvolatile memory 160 shown in FIG. 2 are provided to the semiconductor substrate 100.

The oscillation circuit 120 is arranged in a rectangular area along the side 100a, the side 100b, and the side 100c. The temperature compensation circuit 130 is arranged in an L-shaped area along the side 100a and the side 100c. The output circuit 140 is arranged in an area with a projection along the side 100a. The logic circuit 150 is arranged in a rectangular area along the side 100c and the side 100d. The nonvolatile memory 160 is arranged in a rectangular area located between the arrangement area of the logic circuit 150 and the arrangement area of the temperature compensation circuit 130. The bias circuit 110 is arranged in a rectangular area located between the arrangement area of the logic circuit 150 and the arrangement area of the temperature compensation circuit 130 and along the side 100d.

A pad 185 shaped like a rectangle as the XO terminal and a pad 186 shaped like a rectangle as the XI terminal are arranged in the arrangement area of the oscillation circuit 120 and along the side 100b. A pad 181 shaped like a rectangle as the VDD terminal and a pad 183 shaped like a rectangle as the OUT terminal are arranged across a part of the output circuit 140. A pad 184 shaped like a rectangle as the OE terminal and a pad 182 shaped like a rectangle as the VSS terminal are arranged across the nonvolatile memory 160.

Taking an intersection between the side 100a and the side 100b as an origin, and defining a direction along the side 100a as an x direction, and a direction along the side 100b as a y direction, a value of an x coordinate of the center point of the pad 185 and a value of an x coordinate of the center point of the pad 186 are both x11, a value y13 of a y coordinate of the center point of the pad 185 is higher than a value y12 of a y coordinate of the center point of the pad 186. A value of an x coordinate of the center point of the pad 181 and a value of an x coordinate of the center point of the pad 184 are both x12 higher than x11, and a value of an x coordinate of the center point of the pad 183 and a value of an x coordinate of the center point of the pad 182 are both x13 higher than x12. A value of a y coordinate of the center point of the pad 181 and a value of a y coordinate of the center point of the pad 183 are both y11 lower than y12, and a value of a y coordinate of the center point of the pad 184 and a value of a y coordinate of the center point of the pad 182 are both y14 higher than y13.

Figure 13:
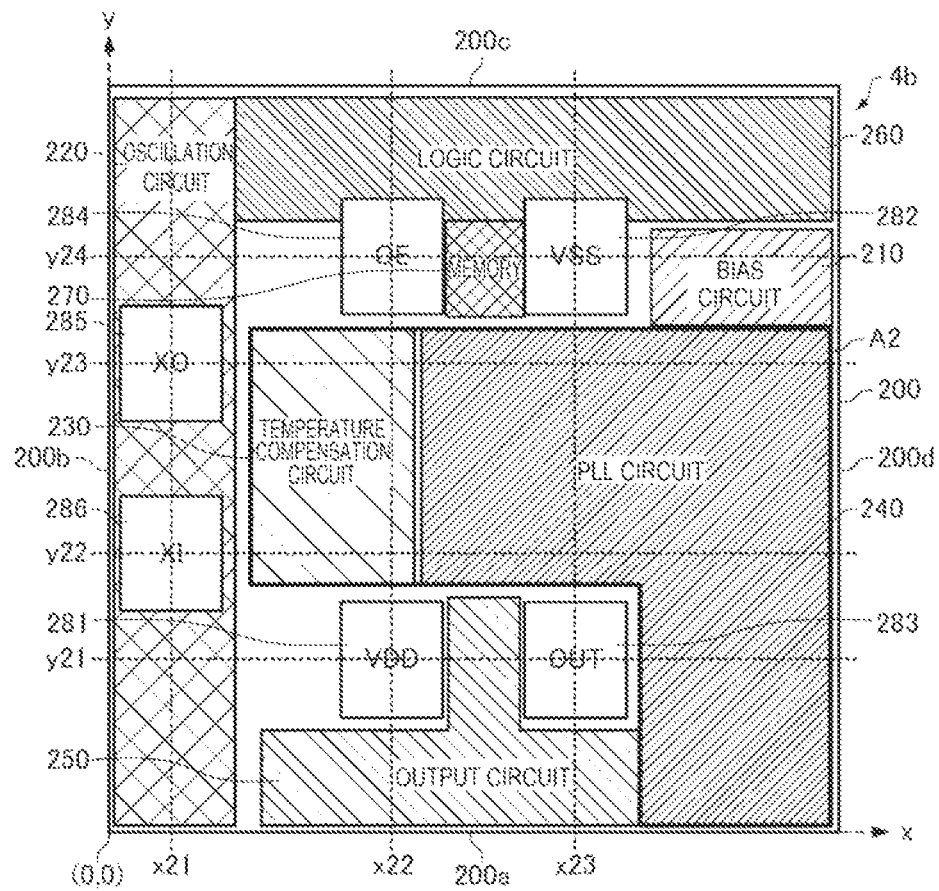
FIG. 13 is a diagram showing an example of a layout arrangement of a second integrated circuit device.

FIG. 13 is a diagram showing an example of a layout arrangement of the second integrated circuit device 4b. In the example shown in FIG. 13, the second integrated circuit device 4b has a semiconductor substrate 200 shaped like a rectangle having four sides 200a, 200b, 200c, and 200d in a plan view. The bias circuit 210, the oscillation circuit 220, the temperature compensation circuit 230, the PLL circuit 240, the output circuit 250, the logic circuit 260, and the nonvolatile memory 270 shown in FIG. 8 are provided to the semiconductor substrate 200.

The oscillation circuit 220 is arranged in a rectangular area along the side 200a, the side 200b, and the side 200c. The PLL circuit 240 is arranged in an L-shaped area along the side 200a and the side 200c. The output circuit 250 is arranged in an area with a projection along the side 200a. The temperature compensation circuit 230 is arranged in a rectangular area located between the arrangement area of the oscillation circuit 220 and the arrangement area of the PLL circuit 240. The logic circuit 260 is arranged in a rectangular area along the side 200c and the side 200d. The nonvolatile memory 270 is arranged in a rectangular area located between the arrangement area of the logic circuit 260 and the arrangement area of the PLL circuit 240. The bias circuit 210 is arranged in a rectangular area located between the arrangement area of the logic circuit 260 and the arrangement area of the PLL circuit 240 and along the side 200d.

A pad 285 shaped like a rectangle as the XO terminal and a pad 286 shaped like a rectangle as the XI terminal are arranged in the arrangement area of the oscillation circuit 220 and along the side 200b. A pad 281 shaped like a rectangle as the VDD terminal and a pad 283 shaped like a rectangle as the OUT terminal are arranged across a part of the output circuit 250. A pad 284 shaped like a rectangle as the OE terminal and a pad 282 shaped like a rectangle as the VSS terminal are arranged across the nonvolatile memory 270.

Taking an intersection between the side 200a and the side 200b as an origin, and defining a direction along the side 200a as an x direction, and a direction along the side 200b as a y direction, a value of an x coordinate of the center point of the pad 285 and a value of an x coordinate of the center point of the pad 286 are both x21, a value y23 of a y coordinate of the center point of the pad 285 is higher than a value y22 of a y coordinate of the center point of the pad 286. A value of an x coordinate of the center point of the pad 281 and a value of an x coordinate of the center point of the pad 284 are both x22 higher than x21, and a value of an x coordinate of the center point of the pad 283 and a value of an x coordinate of the center point of the pad 282 are both x23 higher than x22. A value of a y coordinate of the center point of the pad 281 and a value of a y coordinate of the center point of the pad 283 are both y21 lower than y22, and a value of a y coordinate of the center point of the pad 284 and a value of a y coordinate of the center point of the pad 282 are both y24 higher than y23.

In the examples shown in FIG. 12 and FIG. 13, the pad 181 and the pad 281 are the same in size and shape as each other, the pad 182 and the pad 282 are the same in size and shape as each other, the pad 183 and the pad 283 are the same in size and shape as each other, the pad 184 and the pad 284 are the same in size and shape as each other, the pad 185 and the pad 285 are the same in size and shape as each other, and the pad 186 and the pad 286 are the same in size and shape as each other.

Further, the first integrated circuit device 4a and the second integrated circuit device 4b are the same in size as each other, and at the same time, a relative positional relationship between the pads 181 through 186 and a relative positional relationship between the pads 281 through 286 are the same as each other. In other words, assuming the center points of two arbitrary pads corresponding to each other, for example, the pad 181 and the pad 281, as origins, the coordinates of the center points of the pads 181 through 186 coincide with the coordinates of the center points of the pads 281 through 286, respectively. In particular, in the examples shown in FIG. 12 and FIG. 13, the coordinate (x12, y11) of the center point of the pad 181 and the coordinate (x22, y21) of the center point of the pad 281 are equal to each other, the coordinate (x13, y14) of the center point of the pad 182 and the coordinate (x23, y24) of the center point of the pad 282 are equal to each other, the coordinate (x13, y11) of the center point of the pad 183 and the coordinate (x23, y21) of the center point of the pad 283 are equal to each other, the coordinate (x12, y14) of the center point of the pad 184 and the coordinate (x22, y24) of the center point of the pad 284 are equal to each other, the coordinate (x11, y13) of the center point of the pad 185 and the coordinate (x21, y23) of the center point of the pad 285 are equal to each other, and the coordinate (x11, y12) of the center point of the pad 186 and the coordinate (x21, y22) of the center point of the pad 286 are equal to each other. In other words, the first integrated circuit device 4a and the second integrated circuit device 4b are the same in size as each other, and the positions of the pads 181 through 186 in the first integrated circuit device 4a and the positions of the pads 281 through 286 in the second integrated circuit device 4b are the same as each other, respectively.

Further, the arrangement area of the bias circuit 110 and the arrangement area of the bias circuit 210 are the same, or substantially the same in size, shape, and position as each other. The arrangement area of the oscillation circuit 120 and the arrangement area of the oscillation circuit 220 are the same, or substantially the same in size, shape, and position as each other. The arrangement area of the output circuit 140 and the arrangement area of the output circuit 250 are the same, or substantially the same in size, shape, and position as each other. The arrangement area of the logic circuit 150 and the arrangement area of the logic circuit 260 are the same, or substantially the same in size, shape, and position as each other. The arrangement area of the nonvolatile memory 160 and the arrangement area of the nonvolatile memory 270 are the same, or substantially the same in size, shape, and position as each other. Therefore, it is possible to commonalize the layout of at least a part of a plurality of wiring patterns for coupling the plurality of circuits described above to each other. Further, at least one of the pairs of the oscillation circuit 120 and the oscillation circuit 220, the output circuit 140 and the output circuit 250, the bias circuit 110 and the bias circuit 210, and the logic circuit 150 and the logic circuit 260 can be the same in circuit configuration as each other. When making the oscillation circuit 120 and the oscillation circuit 220 the same in circuit configuration as each other, it is possible to commonalize the layout of the both circuits, when making the output circuit 140 and the output circuit 250 the same in circuit configuration as each other, it is possible to commonalize the layout of the both circuits, when making the bias circuit 110 and the bias circuit 210 the same in circuit configuration as each other, it is possible to commonalize the layout of the both circuits, when making the logic circuit 150 and the logic circuit 260 the same in circuit configuration as each other, it is possible to commonalize the layout of the both circuits. Therefore, it is possible to shorten the development man-hour of the first integrated circuit device 4a or the second integrated circuit device 4b.

Figure 14:
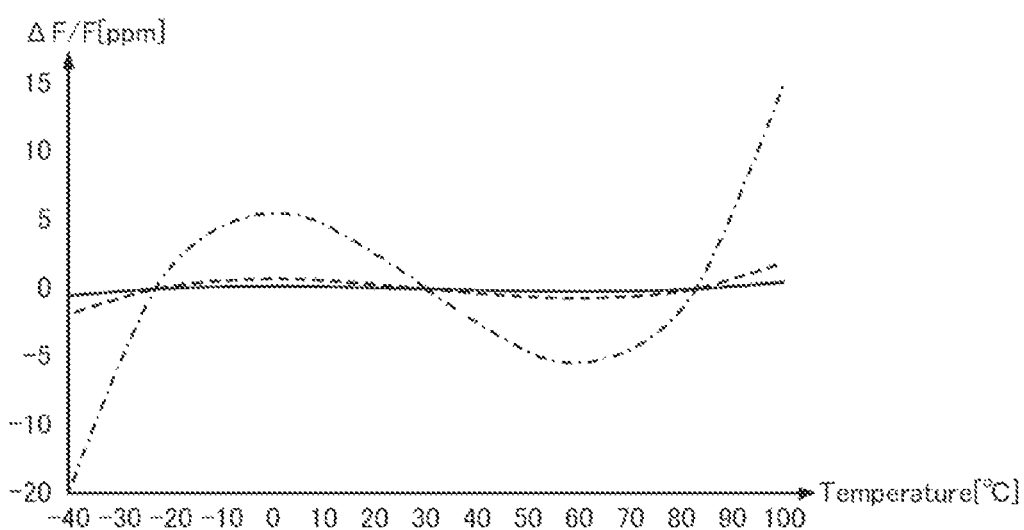
FIG. 14 is a diagram showing an example of a frequency-temperature characteristic.

Further, the PLL circuit 240 is arranged in at least a part of a second area A2 of the second integrated circuit device 4b corresponding to a first area A1 of the first integrated circuit device 4a where the temperature compensation circuit 130 is arranged. The second area A2 is an area the same in size, shape, and position as the first area A1. In the present embodiment, as shown in FIG. 12 and FIG. 13, the size of the temperature compensation circuit 230 is smaller than the size of the temperature compensation circuit 130, and the PLL circuit 240 and the temperature compensation circuit 230 are arranged in at least a part of the second area A2. In other words, since the arrangement area which is large with respect to the temperature compensation circuit 130 is ensured in the first integrated circuit device 4a, it is possible to realize the temperature compensation circuit 130 which increases the number of bits of the temperature compensation data cmpDT to generate the compensation signal corresponding to a term of each of the orders of the temperature compensation function with high resolution, and at the same time, which can generate the compensation signal corresponding to a term of a higher order. Therefore, it is possible to realize the first oscillator 2a capable of outputting the oscillation signal Vout having an extremely high frequency-temperature characteristic. In FIG. 14, an example of the frequency-temperature characteristic of the oscillation signal Vout to be output from the first oscillator 2a is represented by the solid line. In FIG. 14, the dashed-dotted line represents the frequency-temperature characteristic of the first resonator 5a or the second resonator 5b, and the dotted line represents an example of the frequency-temperature characteristic of the oscillation signal Vout to be output from the second oscillator 2b. In FIG. 14, the horizontal axis represents temperature, and the vertical axis represents a frequency deviation with respect to a target frequency. In the example shown in FIG. 14, in a temperature range of −40° C. through +100° C., the frequency deviation of a signal output from the first resonator 5a or the second resonator 5b varies in a range of about ±20 ppm. In a temperature range of −40° C. through +100° C., the frequency deviation of the oscillation signal Vout output from the first oscillator 2a falls into a range narrower than about ±1 ppm while the frequency deviation of the oscillation signal Vout output from the second oscillator 2b is in a range of about ±2 ppm.

Figure 15:
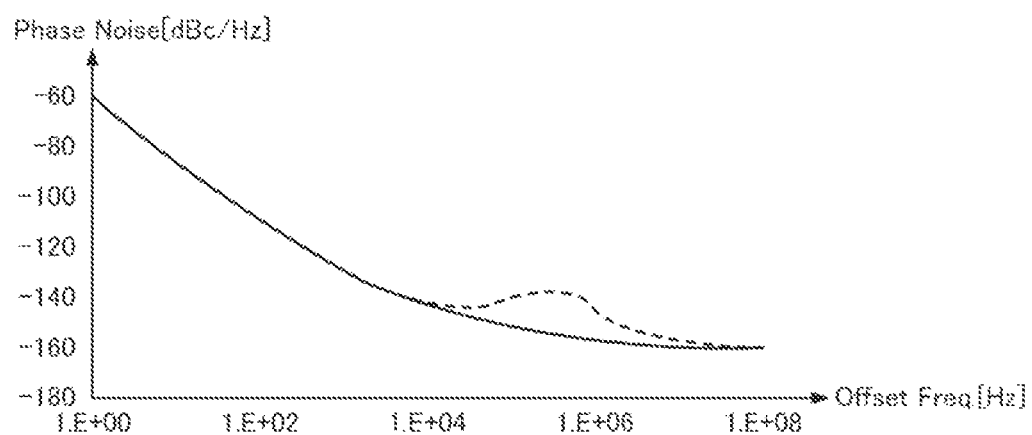
FIG. 15 is a diagram showing an example of a phase noise.

Further, in the first oscillator 2a, since the first integrated circuit device 4a does not include the PLL circuit, a current consumption and a phase noise are reduced to lower levels than in the second oscillator 2b provided with the second integrated circuit device 4b including the PLL circuit 240. In FIG. 15, an example of the phase noise of the oscillation signal Vout to be output from the first oscillator 2a is represented by the solid line. In FIG. 15, the dotted line represents an example of the phase noise of the oscillation signal Vout to be output from the second oscillator 2b. In FIG. 15, the horizontal axis represents an offset frequency assuming the target frequency as zero, the vertical axis represents the phase noise. In the example shown in FIG. 15, no difference in phase noise exists between the oscillators when the offset frequency is no higher than 10 kHz, but the phase noise of the first oscillator 2a is smaller in an offset frequency range of 10 kHz through 100 MHz.

In contrast, in the second oscillator 2b, since the second integrated circuit device 4b includes the PLL circuit 240, it is possible to set the oscillation signal Vout to a desired target frequency with high resolution in a wide frequency range. Further, although the temperature compensation circuit 230 has a simple configuration in which signals corresponding to a fourth-order component and higher-order components of the temperature compensation function are not generated, a good frequency-temperature characteristic of the oscillation signal Vout is realized.

It should be noted that in the present embodiment, the first integrated circuit device 4a and the second integrated circuit device 4b are the same in type, and are the same in size, shape, and positions of the pads as each other. It should be noted that the first integrated circuit device 4a and the second integrated circuit device 4b can be different in type, and can be different in at least one of size, shape, and positions of the pads from each other as long as the first integrated circuit device 4a and the second integrated circuit device 4b can respectively be housed in the first container 3a and the second container 3b which are the same in type as each other.

1-5. Structure of First Oscillator and Second Oscillator

Figure 16:
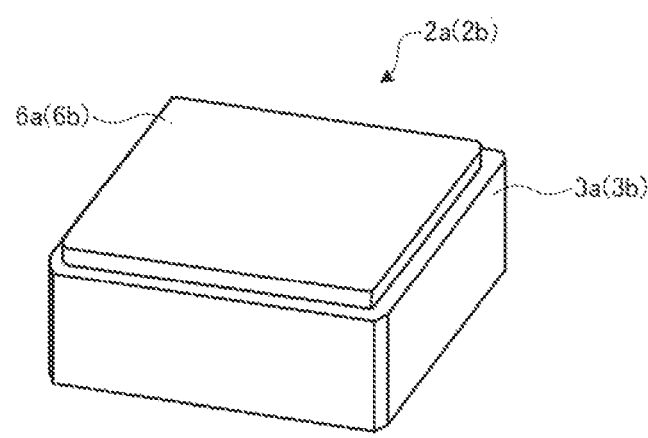
FIG. 16 is a perspective view of the first oscillator and the second oscillator.
Figure 17:
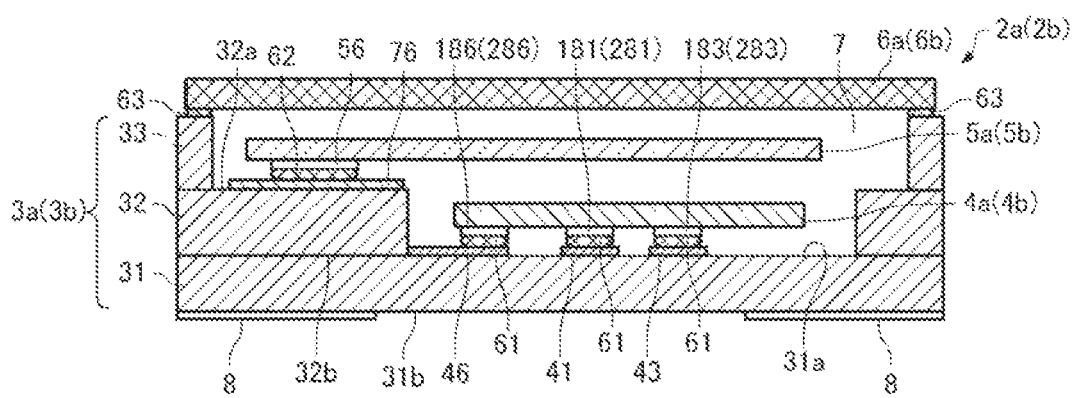
FIG. 17 is a cross-sectional view of the first oscillator and the second oscillator.
Figure 18:
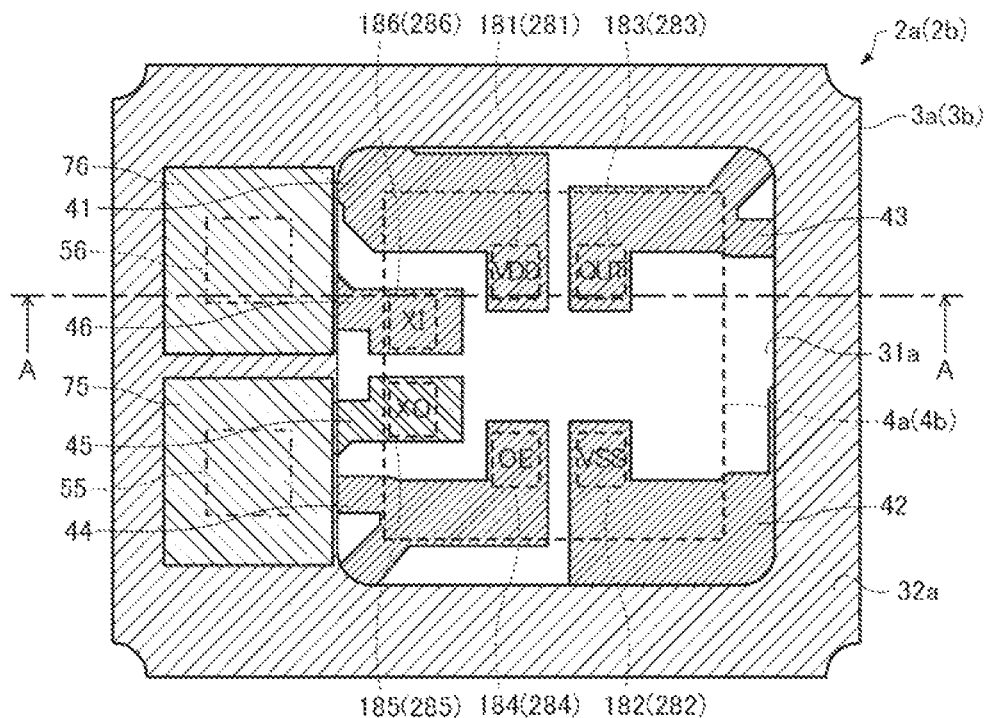
FIG. 18 is a plan view showing a plurality of electrodes provided to a first container and a second container.

FIG. 16, FIG. 17, and FIG. 18 are diagrams showing an example of a structure of the first oscillator 2a and the second oscillator 2b. FIG. 16 is a perspective view of the first oscillator 2a and the second oscillator 2b, and FIG. 17 is a cross-sectional view of the first oscillator 2a and the second oscillator 2b. FIG. 18 is a plan view showing a plurality of electrodes provided to the first container 3a and the second container 3b. It should be noted that FIG. 17 is a cross-sectional view of the first oscillator 2a and the second oscillator 2b along the line A-A in FIG. 18.

As shown in FIG. 16 and FIG. 17, the first oscillator 2a has the first integrated circuit device 4a, the first resonator 5a, the first container 3a for housing the first integrated circuit device 4a and the first resonator 5a, and a first lid 6a for airtightly sealing a housing space 7 in which the first resonator 5a is housed. Similarly, the second oscillator 2b has the second integrated circuit device 4b, the second resonator 5b, the second container 3b for housing the second integrated circuit device 4b and the second resonator 5b, and a second lid 6b for airtightly sealing a housing space 7 in which the second resonator 5b is housed.

The first resonator 5a and the second resonator 5b are each, for example, a tuning fork resonator having quartz crystal as a base material, each oscillate with a resonance frequency due to an outer shape and an outer dimension, and each oscillate with a desired frequency. In the present embodiment, the first resonator 5a and the second resonator 5b are the same in type, and are the same in size, shape, and positions of the terminals as each other. It should be noted that the first resonator 5a and the second resonator 5b can be different in type, and can be different in at least one of size, shape, and positions of the terminals from each other as long as the first resonator 5a and the second resonator 5b can respectively be housed in the first container 3a and the second container 3b which are the same in type as each other.

The first container 3a and the second container 3b are each formed of ceramic, and are each configured by stacking a substrate 31, a first frame substrate 32, and a second frame substrate 33 on one another as shown in FIG. 17 and FIG. 18. As shown in FIG. 17 and FIG. 18, on a first surface 31a of the substrate 31, there are disposed electrodes 41, 42, 43, 44, 45, and 46, and on a second surface 31b of the substrate 31, there is disposed a plurality of external terminals 8. The plurality of external terminals 8 corresponds respectively to the VDD1 terminal, the VSS1 terminal, the OUT1 terminal, and the OE1 terminal shown in FIG. 2 or FIG. 8. The external terminals 8 and the electrodes 41, 42, 43, and 44 are electrically coupled to each other with interconnections, respectively.

Further, as represented by the dotted lines in FIG. 18, the pads 181, 182, 183, 184, 185, and 186 of the first integrated circuit device 4a shown in FIG. 12 and the electrodes 41, 42, 43, 44, 45, and 46 disposed on the first surface 31a of the substrate 31 are electrically and mechanically coupled to each other via bonding members 61 such as an electrically-conductive adhesive or gold bumps, respectively. The pads 181, 182, 183, 184, 185, and 186 correspond respectively to the VDD terminal, the VSS terminal, the OUT terminal, the OE terminal, the XO terminal, and the XI terminal of the first oscillator 2a shown in FIG. 2.

Alternatively, as represented by the dotted lines in FIG. 18, the pads 281, 282, 283, 284, 285, and 286 of the second integrated circuit device 4b shown in FIG. 13 and the electrodes 41, 42, 43, 44, 45, and 46 disposed on the first surface 31a of the substrate 31 are electrically and mechanically coupled to each other via the bonding members 61 such as an electrically-conductive adhesive or gold bumps, respectively. The pads 281, 282, 283, 284, 285, and 286 correspond respectively to the VDD terminal, the VSS terminal, the OUT terminal, the OE terminal, the XO terminal, and the XI terminal of the second oscillator 2b shown in FIG. 8.

As shown in FIG. 17 and FIG. 18, the first frame substrate 32 is an annular substrate in which a portion including the position of the first integrated circuit device 4a or the second integrated circuit device 4b is removed. On a first surface 32a of the first frame substrate 32, there are disposed electrodes 75, 76, and a second surface 32b of the first frame substrate 32 is bonded to the second surface 31b of the substrate 31. Further, as represented by the dashed-dotted lines in FIG. 18, terminals 55, 56 of the first resonator 5a or the second resonator 5b and the electrodes 75, 76 disposed on the first surface 32a of the first frame substrate 32 are electrically and mechanically coupled to each other via bonding members 62 such as an electrically-conductive adhesive or gold bumps, respectively. The electrodes 75, 76 disposed on the first surface 32a of the first frame substrate 32 and the electrodes 45, 46 disposed on the first surface 31a of the substrate 31 are electrically coupled to each other with interconnections not shown, respectively.

As shown in FIG. 17, the second frame substrate 33 is an annular substrate in which a portion including the position of the first resonator 5a or the second resonator 5b is removed. The first lid 6a or the second lid 6b is made of metal, ceramic, glass or the like, and is bonded to the second frame substrate 33 via a bonding member 63 such as a seal ring or low-melting-point glass, and thus, it is possible to form the housing space 7 which houses the first resonator 5a or the second resonator 5b, and which is airtightly sealed. Further, the housing space 7 is an airtight space, and is set in a reduced-pressure state, and is preferably set in a state approximate to a vacuum state.

In the present embodiment, the first container 3a and the second container 3b are containers the same in type as each other. Therefore, the electrodes 41, 42, 43, 44, 45, and 46 provided to the first container 3a and the electrodes 41, 42, 43, 44, 45, and 46 provided to the second container 3b are the same in shape as each other, respectively. Therefore, the electrodes 41, 42, 43, 44, 45, and 46 in the first container 3a and the electrodes 41, 42, 43, 44, 45, and 46 in the second container 3b are the same in position as each other, respectively. Further, as shown in FIG. 12 and FIG. 13, the first integrated circuit device 4a and the second integrated circuit device 4b are the same in size as each other, and the positions of the pads 181 through 186 in the first integrated circuit device 4a and the positions of the pads 281 through 286 in the second integrated circuit device 4b are the same as each other, respectively. Therefore, as shown in FIG. 18, the positions where the pads 181 through 186 of the first integrated circuit device 4a and the electrodes 41 through 46 of the first container 3a are bonded to each other are the same as the positions where the pads 281 through 286 of the second integrated circuit device 4b and the electrodes 41 through 46 of the second container 3b are bonded to each other, respectively. In other words, it is possible to mount the first integrated circuit device 4a and the second integrated circuit device 4b respectively in the first container 3a and the second container 3b the same in type as each other. Therefore, the man-hour for determining conditions of mounting and the man-hour for designing the container become unnecessary with respect to one of the first oscillator 2a and the second oscillator 2b, and thus, the manufacturing cost is reduced as a whole of the first oscillator 2a and the second oscillator 2b.

It should be noted that the electrodes 41, 42, 43, 44, 45, and 46 of the first container 3a are an example of "first through N-th electrodes," and the electrodes 41, 42, 43, 44, 45, and 46 of the second container 3b are an example of "(N+1)-th through 2N-th electrodes." Further, the pads 181, 182, 183, 184, 185, and 186 of the first integrated circuit device 4a are an example of "first through N-th pads," and the pads 281, 282, 283, 284, 285, and 286 of the second integrated circuit device 4b are an example of "(N+1)-th through 2N-th pads." In the present embodiment, the integer N is six.

1-6. Method of Manufacturing Oscillators

Figure 19:
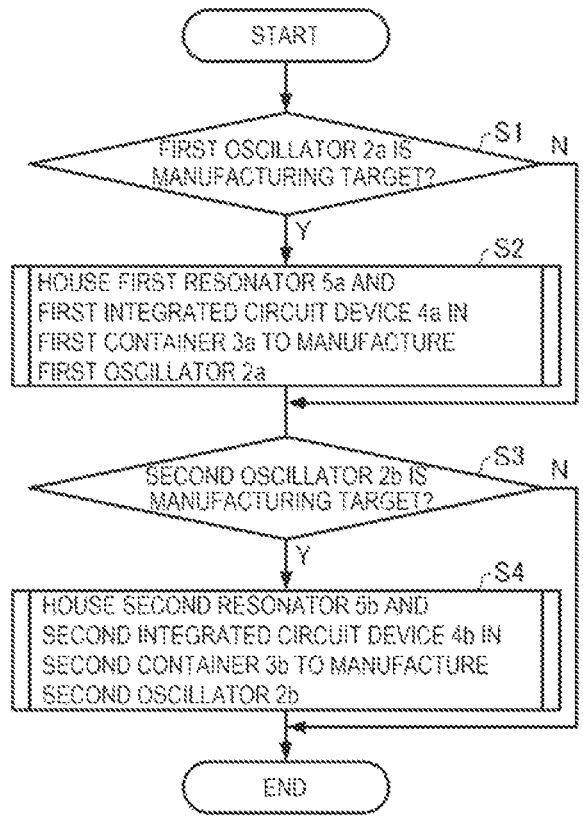
FIG. 19 is a flowchart showing an example of procedures of a method of manufacturing the oscillators according to the embodiment.

FIG. 19 is a flowchart showing an example of procedures of a method of manufacturing the oscillators according to the present embodiment. For example, a manufacturing device not shown executes the procedures shown in FIG. 19.

In the example shown in FIG. 19, when the first oscillator 2a is the manufacturing target in the step S1, the manufacturing device houses the first resonator 5a and the first integrated circuit device 4a in the first container 3a to manufacture the first oscillator 2a in the step S2.

Then, when the second oscillator 2b is the manufacturing target in the step S3, the manufacturing device houses the second resonator 5b and the second integrated circuit device 4b in the second container 3b to manufacture the second oscillator 2b in the step S4.

Figure 20:
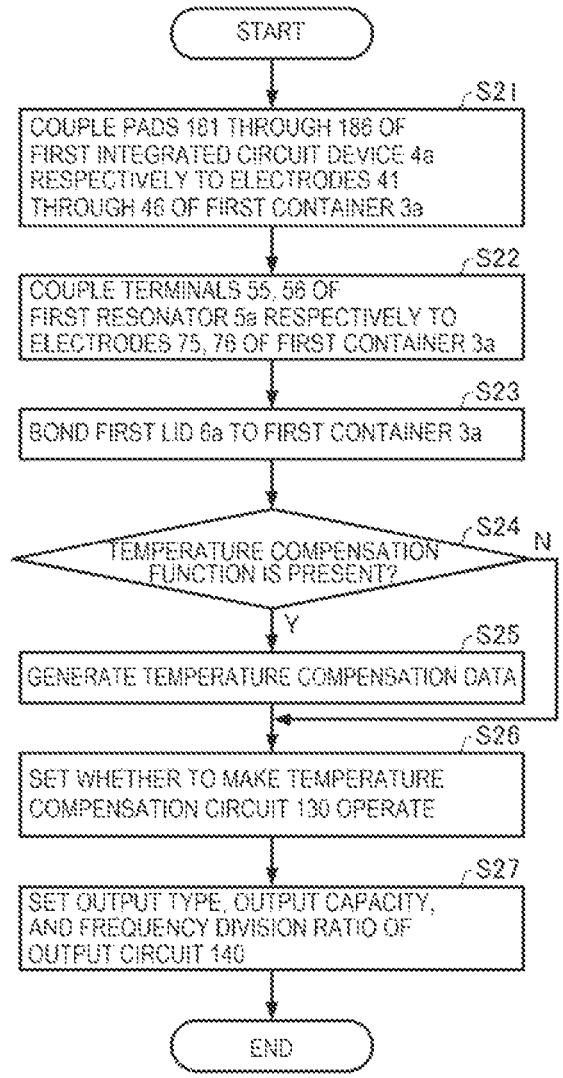
FIG. 20 is a flowchart showing an example of a detailed procedure of the step S2 in FIG. 19.

FIG. 20 is a flowchart showing an example of a detailed procedure of the step S2 in FIG. 19.

In the example shown in FIG. 20, first, in the step S21, the manufacturing device couples the pads 181 through 186 of the first integrated circuit device 4a respectively to the electrodes 41 through 46 of the first container 3a.

Then, in the step S22, the manufacturing device couples the terminals 55, 56 of the first resonator 5a respectively to the electrodes 75, 76 of the first container 3a.

Then, in the step S23, the manufacturing device bonds the first lid 6a to the first container 3a.

Then, when the first oscillator 2a having the temperature compensation function is the manufacturing target in the step S24, the manufacturing device generates the temperature compensation data cmpDT in the step S25. When the first oscillator 2a without the temperature compensation function is the manufacturing target in the step S24, the manufacturing device does not execute the step S25.

Then, in the step S26, the manufacturing device sets whether to make the temperature compensation circuit 130 operate. Specifically, when the first oscillator 2a having the temperature compensation function is the manufacturing target, the manufacturing device writes the temperature compensation function setting bit cmpEN for making the temperature compensation circuit 130 operate into the nonvolatile memory 160, and when the first oscillator 2a without the temperature compensation function is the manufacturing target, the manufacturing device writes the temperature compensation function setting bit cmpEN for inhibiting the temperature compensation circuit 130 from operating into the nonvolatile memory 160.

Lastly, in the step S27, the manufacturing device sets the output type, the output capacity, and the frequency division ratio of the output circuit 140. Specifically, the manufacturing device writes the output setting data outDT in which the output type, the output capacity, and the frequency division ratio are set into the nonvolatile memory 160.

Figure 21:
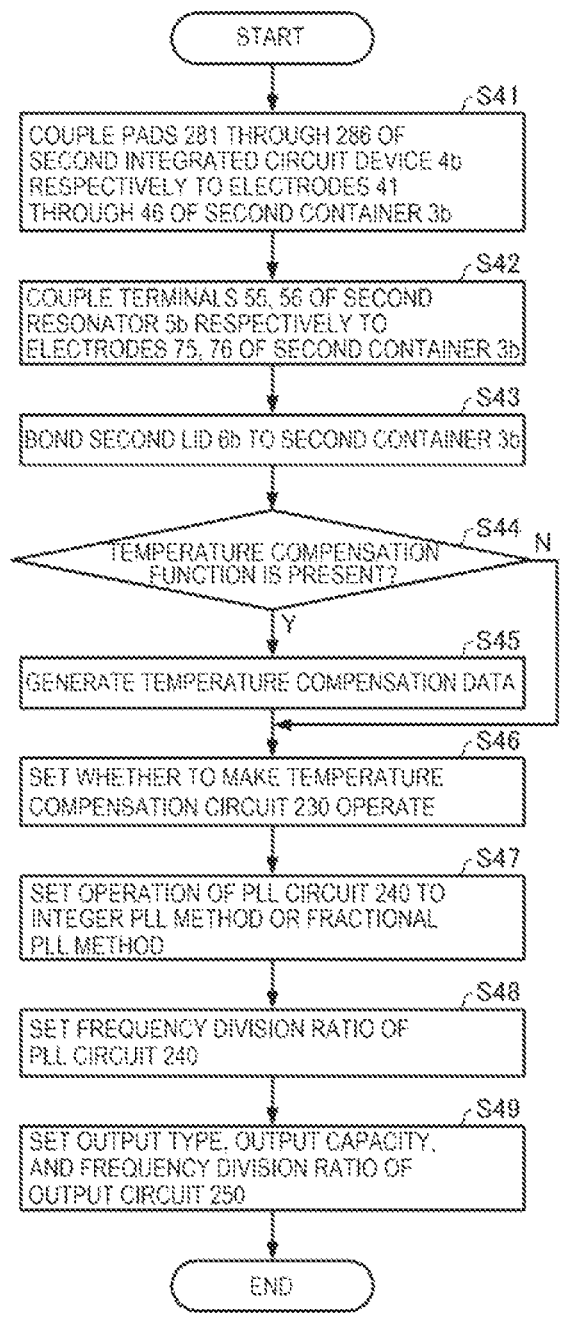
FIG. 21 is a flowchart showing an example of a detailed procedure of the step S4 in FIG. 19.

FIG. 21 is a flowchart showing an example of a detailed procedure of the step S4 in FIG. 19.

In the example shown in FIG. 21, first, in the step S41, the manufacturing device couples the pads 281 through 286 of the second integrated circuit device 4b respectively to the electrodes 41 through 46 of the second container 3b.

Then, in the step S42, the manufacturing device couples the terminals 55, 56 of the second resonator 5b respectively to the electrodes 75, 76 of the second container 3b.

Then, in the step S43, the manufacturing device bonds the second lid 6b to the second container 3b.

Then, when the second oscillator 2b having the temperature compensation function is the manufacturing target in the step S44, the manufacturing device generates the temperature compensation data cmpDT in the step S45. When the second oscillator 2b without the temperature compensation function is the manufacturing target in the step S44, the manufacturing device does not execute the step S45.

Then, in the step S46, the manufacturing device sets whether to make the temperature compensation circuit 230 operate. Specifically, when the second oscillator 2b having the temperature compensation function is the manufacturing target, the manufacturing device writes the temperature compensation function setting bit cmpEN for making the temperature compensation circuit 230 operate into the nonvolatile memory 270, and when the second oscillator 2b without the temperature compensation function is the manufacturing target, the manufacturing device writes the temperature compensation function setting bit cmpEN for inhibiting the temperature compensation circuit 230 from operating into the nonvolatile memory 270.

Then, in the step S47, the manufacturing device sets the operation of the PLL circuit 240 to one of the integer PLL method and the fractional PLL method, and in the step S48, the manufacturing device sets the frequency division ratio of the PLL circuit 240. Specifically, in the steps S47, S48, the manufacturing device writes the PLL setting data pllDT in which the PLL method and the frequency division ratio are set into the nonvolatile memory 270.

Lastly, in the step S49, the manufacturing device sets the output type, the output capacity, and the frequency division ratio of the output circuit 250. Specifically, the manufacturing device writes the output setting data outDT in which the output type, the output capacity, and the frequency division ratio are set into the nonvolatile memory 270.

It should be noted that the first oscillator 2a and the second oscillator 2b can be manufactured in the same factory, or can also be manufactured in respective factories different from each other. Further, the first oscillator 2a and the second oscillator 2b can be manufactured in the same country, or can also be manufactured in respective countries different from each other.

1-7. Functions and Advantages

As described hereinabove, according to the first embodiment, since the first resonator 5a and the first integrated circuit device 4a without the PLL circuit are housed in the first container 3a to manufacture the first oscillator 2a, and the second resonator 5b and the second integrated circuit device 4b having the PLL circuit 240 are housed in the second container 3b to manufacture the second oscillator 2b, it is possible to manufacture a plurality of types of oscillators different in function related to the output frequency from each other. Further, according to the first embodiment, since the first container 3a and the second container 3b are the containers the same in type, the man-hour for determining the mounting conditions and the man-hour for designing the container become unnecessary in the development of one of the first oscillator 2a and the second oscillator 2b, and thus, it is possible to efficiently manufacture the plurality of types of oscillators at low cost.

Further, in the first embodiment, the positions of the pads 181 through 186 in the first integrated circuit device 4a and the positions of the pads 281 through 286 in the second integrated circuit device 4b are the same as each other, respectively. Therefore, according to the first embodiment, since the six positions where the pads 181 through 186 are respectively coupled to the electrodes 41 through 46 of the first container 3a are the same as the six positions where the pads 281 through 286 are respectively coupled to the electrodes 41 through 46 of the second container 3b, the degree of freedom of the size and the shape of the electrodes 41 through 46 increases.

Further, in the first embodiment, since the first resonator 5a and the second resonator 5b are the same in size and shape as each other, and the first integrated circuit device 4a and the second integrated circuit device 4b are the same in size and shape as each other, it is possible to provide the first container 3a and the second container 3b with optimum sizes.

Further, according to the first embodiment, it becomes possible to commonalize the layout of the circuits except the temperature compensation circuit 130 in the first integrated circuit device 4a and the layout of the circuits except the temperature compensation circuit 230 and the PLL circuit 240 in the second integrated circuit device 4b, and thus, it is possible to shorten the development man-hour of one of the first integrated circuit device 4a and the second integrated circuit device 4b, and therefore, the manufacturing cost of one of the first oscillator 2a and the second oscillator 2b is reduced.

Further, according to the first embodiment, since the second integrated circuit device 4b is provided with the PLL circuit 240 and the temperature compensation circuit 230, it is possible to manufacture the second oscillator 2b which can set the target frequency in a wide frequency range, and at the same time, which has a good frequency-temperature characteristic. Further, the PLL circuit 240 and the temperature compensation circuit 230 are arranged in the second area A2 of the second integrated circuit device 4b corresponding to the first area A1 of the first integrated circuit device 4a where the temperature compensation circuit 130 is arranged. Therefore, since the arrangement area which is large with respect to the temperature compensation circuit 130 is ensured in the first integrated circuit device 4a, it is possible to realize the temperature compensation circuit 130 which generates the compensation signal corresponding to the term of each of the orders of the temperature compensation function with high resolution, and at the same time, which can generate the compensation signal corresponding to the term of a higher order. Therefore, according to the first embodiment, it is possible to manufacture the first oscillator 2a having a high frequency-temperature characteristic.

Further, according to the first embodiment, it is possible to manufacture the first oscillator 2a having the high frequency-temperature characteristic by setting the temperature compensation circuit 130 so as to operate, and it is possible to manufacture the first oscillator 2a low in current consumption by setting the temperature compensation circuit 130 so as not to operate.

Further, according to the first embodiment, by setting the operation of the PLL circuit 240 to the integer PLL method, it is possible to manufacture the second oscillator 2b in which the target frequency can be set in the wide frequency range, and which is low in current consumption, and by setting the operation of the PLL circuit 240 to the fractional PLL method, it is possible to manufacture the second oscillator 2b in which the target frequency can be set in the wide frequency range with high resolution.

2. Second Embodiment

Hereinafter, regarding the second embodiment, substantially the same constituents as those in the first embodiment will be denoted by the same reference numerals, and different contents from those in the first embodiment are mainly described while omitting or simplifying substantially the same description as in the first embodiment.

Since structures of the first oscillator 2a and the second oscillator 2b in the second embodiment are substantially the same as shown in FIG. 16 through FIG. 18, the illustration and the description thereof will be omitted. Further, since a functional block diagram of the first integrated circuit device 4a is substantially the same as shown in FIG. 2, and a functional block diagram of the second integrated circuit device 4b is substantially the same as shown in FIG. 8, the illustration and the description thereof will be omitted. Further, since a layout arrangement of the second integrated circuit device 4b is substantially the same as shown in FIG. 13, the illustration and the description thereof will be omitted. Further, since an example of the procedures of the method of manufacturing the oscillators according to the second embodiment is substantially the same as shown in FIG. 19 through FIG. 21, the illustration and the explanation thereof will be omitted.

Figure 22:
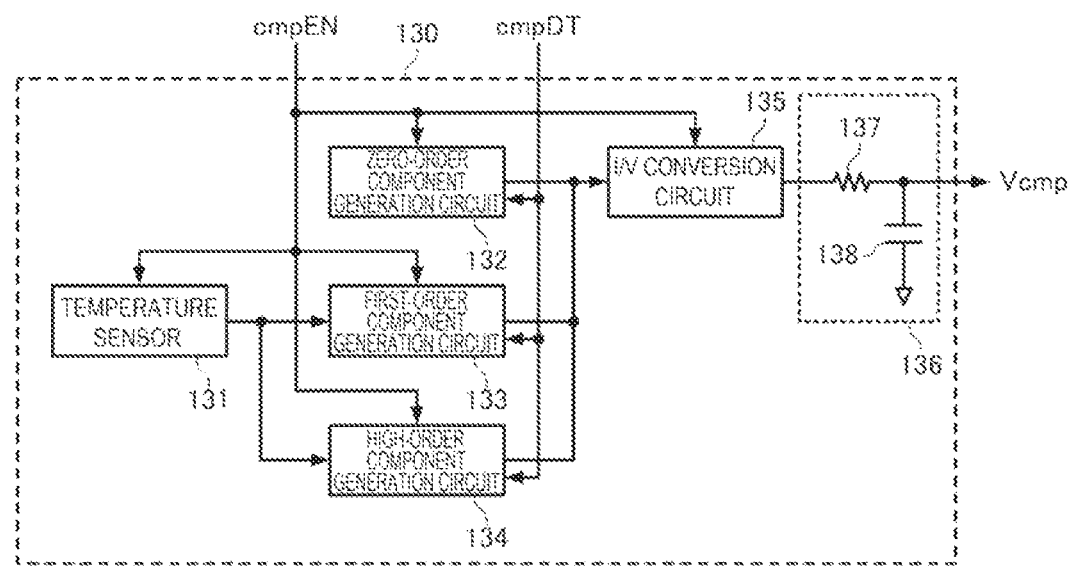
FIG. 22 is a diagram showing a configuration example of a temperature compensation circuit of a first oscillator in a second embodiment.

The second embodiment is different in configuration of the temperature compensation circuit 130 provided to the first integrated circuit device 4a from the first embodiment. FIG. 22 is a diagram showing a configuration example of the temperature compensation circuit 130 in the second embodiment. In the example shown in FIG. 22, the temperature compensation circuit 130 includes the temperature sensor 131, the zero-order component generation circuit 132, the first-order component generation circuit 133, the high-order component generation circuit 134, the I/V conversion circuit 135, and an RC lowpass filter 136.

Since the functions of the temperature sensor 131, the zero-order component generation circuit 132, the first-order component generation circuit 133, the high-order component generation circuit 134, and the I/V conversion circuit 135 are substantially the same as in the first embodiment, the description thereof will be omitted.

The RC lowpass filter 136 is a lowpass filter including a resistive element 137 and a capacitive element 138, and a signal output from the I/V conversion circuit 135 is input to the RC lowpass filter 136, and then the RC lowpass filter 136 outputs the temperature compensation signal Vcmp. In other words, the RC lowpass filter 136 reduces a noise included in the temperature compensation signal Vcmp.

Figure 23:
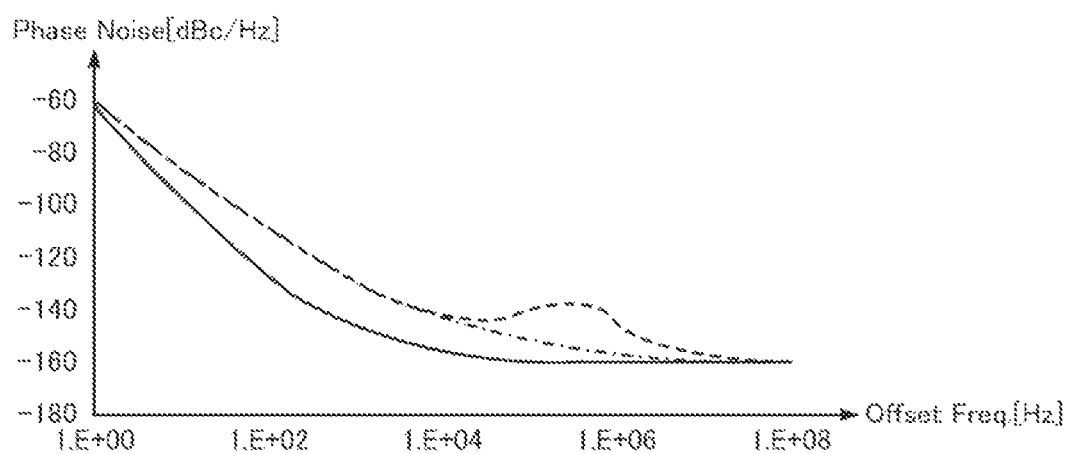
FIG. 23 is a diagram showing an example of a phase noise in the second embodiment.

Since in the first oscillator 2a in the second embodiment, the first integrated circuit device 4a is provided with the RC lowpass filter 136, the phase noise is reduced to a lower level than in the first embodiment. In FIG. 23, an example of the phase noise of the oscillation signal Vout to be output from the first oscillator 2a in the second embodiment is represented by the solid line. In FIG. 23, the dotted line represents the phase noise in the oscillation signal Vout to be output from the second oscillator 2b represented by the dotted lines in FIG. 15, and the dashed-dotted line represents the phase noise in the oscillation signal Vout to be output from the first oscillator 2a in the first embodiment represented by the solid lines in FIG. 15. In FIG. 23, the horizontal axis represents an offset frequency assuming the target frequency as zero, the vertical axis represents the phase noise. In the example shown in FIG. 23, the first oscillator 2a in the second embodiment is reduced in phase noise in an offset frequency band no higher than 1 MHz to a lower level than the first oscillator 2a in the first embodiment.

It should be noted that the layout arrangement of the first integrated circuit device 4a can substantially the same as shown in FIG. 12. On this occasion, in order to ensure an area necessary to arrange the RC lowpass filter 136 in the first area A1 where the temperature compensation circuit 130 is arranged, for example, it is possible for the high-order component generation circuit 134 to be arranged to output a current signal corresponding to each of the terms from the second order to the fifth order of the temperature compensation function. By arranging that the high-order component generation circuit 134 does not generate current signals corresponding to the sixth-order term and the seventh-order term of the temperature compensation function, the arrangement area of the high-order component generation circuit 134 becomes smaller than in the first embodiment, and therefore, it is sufficient to arrange the RC lowpass filter 136 in the area corresponding to the reduction in the arrangement area for the high-order component generation circuit 134. In particular, since an effect of decreasing the phase noise is higher when increasing the capacitance value of the capacitive element 138 than when increasing the resistance value of the resistive element 137, it is preferable to enlarge the capacitive element 138 and arrange the capacitive element 138 in the first area A1.

According to the second embodiment described hereinabove, substantially the same advantages as in the first embodiment can be obtained. Further, according to the second embodiment, since the temperature compensation circuit 130 includes the RC lowpass filter 136 for reducing the noise included in the temperature compensation signal Vcmp, it is possible to manufacture the first oscillator 2a reduced in phase noise.

3. Third Embodiment

Hereinafter, regarding the third embodiment, substantially the same constituents as those in the first embodiment or the second embodiment will be denoted by the same reference numerals, and different contents from those in the first embodiment and the second embodiment are mainly described while omitting or simplifying substantially the same description as in the first embodiment or the second embodiment.

Since structures of the first oscillator 2a and the second oscillator 2b in the third embodiment are substantially the same as shown in FIG. 16 through FIG. 18, the illustration and the description thereof will be omitted. Further, since a functional block diagram of the first integrated circuit device 4a is substantially the same as shown in FIG. 2, and a functional block diagram of the second integrated circuit device 4b is substantially the same as shown in FIG. 8, the illustration and the description thereof will be omitted. Further, since a layout arrangement of the second integrated circuit device 4b is substantially the same as shown in FIG. 13, the illustration and the description thereof will be omitted. Further, since an example of the procedures of the method of manufacturing the oscillators according to the second embodiment is substantially the same as shown in FIG. 19 through FIG. 21, the illustration and the explanation thereof will be omitted.

In the first embodiment or the second embodiment, the oscillation circuit 120 provided to the first integrated circuit device 4a and the oscillation circuit 220 provided to the second integrated circuit device 4b are the same in circuit configuration and layout as each other.

In contrast, in the third embodiment, a size of the MOS transistor 121 included in the oscillation circuit 120 is larger than a size of the MOS transistor 221 included in the oscillation circuit 220. Similarly, a size of the MOS transistor 122 included in the oscillation circuit 120 is larger than a size of the MOS transistor 222 included in the oscillation circuit 220. Here, the size means a product of a gate width W and a gate length L. For example, when the gate width W of the MOS transistors 121, 122 is twice as large as the gate width W of the MOS transistors 221, 222, respectively, and at the same time, the gate length L of the MOS transistors 121, 122 is twice as large as the gate length L of the MOS transistors 221, 222, respectively, the size of the MOS transistors 121, 122 is four times as large as the size of the MOS transistors 221, 222, respectively.

As described above, since the first oscillator 2a in the third embodiment is large in size of the MOS transistors 121, 122 included in the oscillation circuit 120, a 1/f noise generated in the MOS transistors 121, 122 is reduced, and thus the phase noise is reduced to a lower level than in the first embodiment similarly to the second embodiment. It should be noted that in the third embodiment, since the size of the MOS transistors 221, 222 are larger than in the first embodiment or the second embodiment, the arrangement area of the oscillation circuit 120 also becomes larger.

Figure 24:
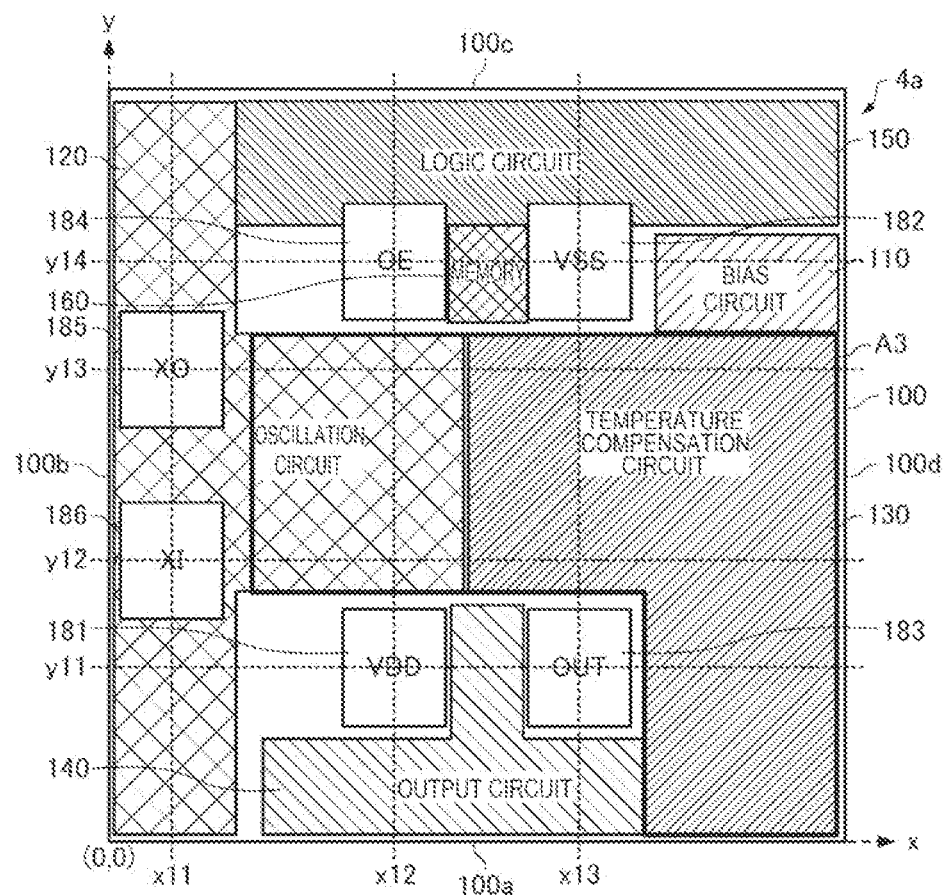
FIG. 24 is a diagram showing an example of a layout arrangement of a first integrated circuit device in a third embodiment.

FIG. 24 is a diagram showing an example of a layout arrangement of the first integrated circuit device 4a in the third embodiment. When comparing FIG. 24 with FIG. 12, the arrangement area of the oscillation circuit 120 is made larger. Specifically, as shown in FIG. 24, a part of the oscillation circuit 120, namely a part or the whole of the MOS transistors 121, 122, is arranged together with the temperature compensation circuit 130 in a third area A3 of the first integrated circuit device 4a, the third area A3 corresponding to the second area A2 in which the PLL circuit 240 of the second integrated circuit device 4b is arranged, the second area A2 being shown in FIG. 13. The third area A3 is an area the same in size, shape, and position as the second area A2. As described above, in order to arrange a part of the oscillation circuit 120 in the third area A3, it is necessary to make the arrangement area of the temperature compensation circuit 130 smaller than in the first embodiment or the second embodiment. For example, in the configuration shown in FIG. 5, it is possible to arrange that the high-order component generation circuit 134 outputs current signals corresponding respectively to the second-order term through the fifth-order term of the temperature compensation function. By inhibiting the high-order component generation circuit 134 from generating the current signals corresponding to the sixth-order term and the seventh-order term of the temperature compensation function, the arrangement area of the high-order component generation circuit 134 becomes smaller than in the first embodiment. Alternatively, it is possible to eliminate the RC low-pass filter 136 from the configuration shown in FIG. 22.

According to the third embodiment described hereinabove, substantially the same advantages as in the first embodiment can be obtained. Further, according to the third embodiment, since the 1/f noise generated in the MOS transistors 121, 122 included in the oscillation circuit 120 is reduced, it is possible to manufacture the first oscillator 2a reduced in phase noise.

4. Modified Examples

The present disclosure is not limited to the present embodiments, but can be implemented with a variety of modifications within the scope or the spirit of the present disclosure.

Although the pads 181 through 186 of the first integrated circuit device 4a and the pads 281 through 286 of the second integrated circuit device 4b are the same in size, shape, and position as each other, respectively, in each of the embodiments described above, the pads 181 through 186 and the pads 281 through 286 can be different in at least one of size, shape, and position from each other as long as the pads 181 through 186 and the electrodes 41 through 46 of the first container 3a can be coupled to each other, respectively, and at the same time, the pads 281 through 286 and the electrodes 41 through 46 of the second container 3b can be coupled to each other, respectively. Further, the arrangement and the functions of the pads 181 through 186 and the pads 281 through 286 are not limited to the examples cited in the embodiments described above.

Further, the first integrated circuit device 4a has the six pads 181 through 186, and the six electrodes 41 through 46 to be coupled respectively to the pads 181 through 186 are provided to the first container 3a in the embodiments described above, but the number of the pads provided to the first integrated circuit device 4a and the number of the electrodes provided to the first container 3a are not limited to six. Similarly, the second integrated circuit device 4b has the six pads 281 through 286, and the six electrodes 41 through 46 to be coupled respectively to the pads 281 through 286 are provided to the second container 3b in the embodiments described above, but the number of the pads provided to the second integrated circuit device 4b and the number of the electrodes provided to the second container 3b are not limited to six. For example, when the first oscillator 2a and the second oscillator 2b are each an oscillator outputting a differential oscillation signal, or when the first oscillator 2a and the second oscillator 2b are each an oscillator varying the frequency of the oscillation signal based on an external control signal, the number of the pads to be provided to the first integrated circuit device 4a and the second integrated circuit device 4b and the number of the electrodes provided to the first container 3a and the second container 3b can be larger than six. In other words, with respect to an arbitrary integer N no smaller than two, it is possible to provide the first integrated circuit device 4a with first through N-th pads, provide the first container 3a with first through N-th electrodes to be coupled respectively to the first through N-th pads, provide the second integrated circuit device 4b with (N+1)-th through 2N-th pads, and provide the second container 3b with (N+1)-th through 2N-th electrodes to be coupled respectively to the (N+1)-th through 2N-th pads.

Further, although in the present embodiments described above, the first oscillator 2a is an oscillator having a single seal structure in which the first integrated circuit device 4a and the first resonator 5a are housed in the same space, and similarly, the second oscillator 2b is an oscillator having the single seal structure in which the second integrated circuit device 4b and the second resonator 5b are housed in the same space as shown in FIG. 17, the first oscillator 2a and the second oscillator 2b are not limited to the oscillators having the single seal structure. For example, the first oscillator 2a can be an oscillator having a structure in which the first integrated circuit device 4a is arranged outside the housing space of the first resonator 5a, and similarly, the second oscillator 2b can be an oscillator having a structure in which the second integrated circuit device 4b is arranged outside the housing space of the second resonator 5b.

Further, although the tuning fork resonator having quartz crystal as the base material is cited as an example of the first resonator 5a and the second resonator 5b in the embodiments described above, as the base material of the first resonator 5a and the second resonator 5b, there can be used a piezoelectric single crystal such as lithium tantalate, lithium niobate, a piezoelectric material such as piezoelectric ceramics such as lead zirconate titanate, or a silicon semiconductor material besides quartz crystal. Further, the first resonator 5a and the second resonator 5b can each be, for example, an AT-cut quartz crystal resonator, or can also be an SAW resonator, or an MEMS resonator. SAW is an abbreviation for Surface Acoustic Wave, and MEMS is an abbreviation for Micro Electro-Mechanical Systems. Further, as an excitation device for the first resonator 5a and the second resonator 5b, there can be used a device using a piezoelectric effect, or electrostatic drive using a Coulomb force.

The embodiments and the modified examples described above are illustrative only, and the present disclosure is not limited to the embodiments and the modified examples. For example, it is also possible to arbitrarily combine any of the embodiments and the modified examples with each other.

The present disclosure includes configurations substantially the same as the configuration described as the embodiment such as configurations having the same function, the same way, and the same result, or configurations having the same object and the same advantage. Further, the present disclosure includes configurations obtained by replacing a non-essential part of the configuration described as the embodiment. Further, the present disclosure includes configurations providing the same functions and advantages, and configurations capable of achieving the same object as those of the configuration described as the embodiment. Further, the present disclosure includes configurations obtained by adding a known technology to the configuration described as the embodiment.

The following contents derive from the embodiments and the modified examples described above.

A method of manufacturing an oscillator according to an aspect of the present disclosure is a method of manufacturing a plurality of types of oscillators including a first oscillator and a second oscillator, the method including housing a first resonator and a first integrated circuit device configured to oscillate the first resonator in a first container to manufacture the first oscillator, and housing a second resonator and a second integrated circuit device configured to oscillate the second resonator in a second container to manufacture the second oscillator, wherein the first integrated circuit device includes a first oscillation circuit configured to oscillate the first resonator to output a first oscillation signal, and no PLL circuit, the second integrated circuit device includes a second oscillation circuit configured to oscillate the second resonator to output a second oscillation signal, and a PLL circuit to which the second oscillation signal is input, and which is configured to output a third oscillation signal, and the first container and the second container are containers same in type.

According to the method of manufacturing the oscillator, since the first resonator and the first integrated circuit device with no PLL circuit are housed in the first container to manufacture the first oscillator, and the second resonator and the second integrated circuit device having the PLL circuit are housed in the second container to manufacture the second oscillator, it is possible to manufacture a plurality of types of oscillators different in function related to the output frequency from each other. Further, according to the method of manufacturing the oscillator, since the first container and the second container are the containers same in type, the man-hour for determining the mounting conditions and the man-hour for designing the container become unnecessary in the development of one of the first oscillator and the second oscillator, and thus, it is possible to efficiently manufacture the plurality of types of oscillators at low cost.

In the method of manufacturing the oscillator according to the above aspect, defining N as an integer equal to or greater than 2, the first container may be provided with first through N-th electrodes, the second container may be provided with (N+1)-th through 2N-th electrodes, the first integrated circuit device may have first through N-th pads, the second integrated circuit device may have (N+1)-th through 2N-th pads, with respect to each of integers i no smaller than 1 and no greater than N, the i-th electrode may be same in shape as the (N+i)-th electrode, and a position of the i-th electrode in the first container may be same as a position of the (N+i)-th electrode in the second container, the manufacturing the first oscillator may include coupling the first through N-th pads respectively to the first through N-th electrodes, and the manufacturing the second oscillator may include coupling the (N+1)-th through 2N-th pads respectively to the (N+1)-th through 2N-th electrodes.

In the method of manufacturing the oscillator according to the above aspect, with respect to each of the integers i, a position of the i-th pad in the first integrated circuit device may be same as a position of the (N+i)-th pad in the second integrated circuit device.

According to the method of manufacturing the oscillator, since it is possible to make the N positions where the first through N-th pads are coupled respectively to the first through N-th electrodes the same as N positions where the (N+1)-th through 2N-th pads are coupled respectively to the (N+1)-th through 2N-th electrodes, a degree of freedom of sizes and shapes of the first through N-th electrodes and the (N+1)-th through 2N-th electrodes increases.

In the method of manufacturing the oscillator according to the above aspect, the first integrated circuit device and the second integrated circuit device may be same in size as each other.

In the method of manufacturing the oscillator according to the above aspect, the first integrated circuit device may include a first temperature compensation circuit configured to output a first temperature compensation signal configured to compensate a frequency-temperature characteristic of the first oscillation signal, and the PLL circuit may be arranged in at least a part of a second area of the second integrated circuit device corresponding to a first area of the first integrated circuit device where the first temperature compensation circuit is arranged.

According to the method of manufacturing the oscillator, since the arrangement area which is large with respect to the first temperature compensation circuit is ensured in the first integrated circuit device, it is possible to realize the temperature compensation circuit which generates a compensation signal corresponding to a term of each of orders of a temperature compensation function with high resolution, and at the same time, which can generate the compensation signal corresponding to the term of a higher order. Therefore, according to the method of manufacturing the oscillator, it is possible to manufacture the first oscillator having a high frequency-temperature characteristic.

In the method of manufacturing the oscillator according to the above aspect, the first temperature compensation circuit may include an RC lowpass filter configured to reduce a noise included in the first temperature compensation signal.

According to the method of manufacturing the oscillator, it is possible to manufacture the first oscillator reduced in phase noise.

In the method of manufacturing the oscillator according to the above aspect, the second integrated circuit device may include a second temperature compensation circuit configured to output a second temperature compensation signal configured to compensate a frequency-temperature characteristic of the second oscillation signal, a size of the second temperature compensation circuit may be smaller than a size of the first temperature compensation circuit, and the PLL circuit and the second temperature compensation circuit may be arranged in at least a part of the second area.

According to the method of manufacturing the oscillator, it is possible to manufacture the second oscillator in which a target frequency can be set in a wide frequency range, and at the same time, which has a good frequency-temperature characteristic.

In the method of manufacturing the oscillator according to the above aspect, the first integrated circuit device may be configured to set whether to make the first temperature compensation circuit operate, and the manufacturing the first oscillator may include setting whether to make the first temperature compensation circuit operate.

According to the method of manufacturing the oscillator, it is possible to manufacture the first oscillator having the high frequency-temperature characteristic by setting the first temperature compensation circuit so as to operate, and it is possible to manufacture the first oscillator low in current consumption by setting the first temperature compensation circuit so as not to operate.

In the method of manufacturing the oscillator according to the above aspect, the first oscillation circuit may include a first amplifier circuit configured to amplify a signal from the first resonator to output the first oscillation signal, and a first current source having a first transistor configured to supply the first amplifier circuit with a first current, the second oscillation circuit may include a second amplifier circuit configured to amplify a signal from the second resonator to output the second oscillation signal, and a second current source having a second transistor configured to supply the second amplifier circuit with a second current, and the first transistor may be larger in size than the second transistor.

According to the method of manufacturing the oscillator, since a 1/f noise generated in the first transistor is reduced, it is possible to manufacture the first oscillator reduced in phase noise.

In the method of manufacturing the oscillator according to the above aspect, the second integrated circuit device is configured to set an operation of the PLL circuit to one of an integer PLL method and a fractional PLL method, and the manufacturing the second oscillator includes setting the operation of the PLL circuit to one of the integer PLL method and the fractional PLL method.

According to the method of manufacturing the oscillator, by setting the operation of the PLL circuit to the integer PLL method, it is possible to manufacture the second oscillator in which the target frequency can be set in the wide frequency range, and which is low in current consumption, and by setting the operation of the PLL circuit to the fractional PLL method, it is possible to manufacture the second oscillator in which the target frequency can be set in the wide frequency range with high resolution.

An oscillator according to an aspect of the present disclosure is an oscillator included in an oscillator group consisting of a plurality of types of oscillators, the oscillator including a first resonator, a first integrated circuit device configured to oscillate the first resonator, and a first container configured to house the first resonator and the first integrated circuit device, wherein the first integrated circuit device includes a first oscillation circuit configured to oscillate the first resonator to output a first oscillation signal, and no PLL circuit, another oscillator included in the oscillator group includes a second resonator, a second integrated circuit device configured to oscillate the second resonator, and a second container configured to house the second resonator and the second integrated circuit device, the second integrated circuit device includes a second oscillation circuit configured to oscillate the second resonator to output a second oscillation signal, and a PLL circuit to which the second oscillation signal is input, and which is configured to output a third oscillation signal, and the first container and the second container are containers same in type.

Since the present oscillator has the first resonator and the first integrated circuit device with no PLL circuit housed in the first container, and another oscillator included in the oscillator group has the second resonator and the second integrated circuit device having the PLL circuit housed in the second container, the two oscillators are different in function related to the output frequency from each other. Further, since the first container and the second container are the containers the same in type, the man-hour for determining the mounting conditions and the man-hour for designing the container become unnecessary in the development of one of this oscillator and the other oscillator, and thus, it is possible to efficiently manufacture the plurality of types of oscillators at low cost.

An oscillator according to another aspect of the present disclosure is an oscillator included in an oscillator group consisting of a plurality of types of oscillators, the oscillator including a second resonator, a second integrated circuit device configured to oscillate the second resonator, and a second container configured to house the second resonator and the second integrated circuit device, wherein the second integrated circuit device includes a second oscillation circuit configured to oscillate the second resonator to output a second oscillation signal, and a PLL circuit to which the second oscillation signal is input, and which is configured to output a third oscillation signal, another oscillator included in the oscillator group includes a first resonator, a first integrated circuit device configured to oscillate the first resonator, and a first container configured to house the first resonator and the first integrated circuit device, the first integrated circuit device includes a first oscillation circuit configured to oscillate the first resonator to output a first oscillation signal, and no PLL circuit, and the first container and the second container are containers same in type.

Since the present oscillator has the second resonator and the second integrated circuit device having the PLL circuit housed in the second container, and another oscillator included in the oscillator group has the first resonator and the first integrated circuit device with no PLL circuit housed in the first container, the two oscillators are different in function related to the output frequency from each other. Further, since the first container and the second container are the containers the same in type, the man-hour for determining the mounting conditions and the man-hour for designing the container become unnecessary in the development of one of this oscillator and the other oscillator, and thus, it is possible to efficiently manufacture the plurality of types of oscillators at low cost.

What is claimed is:

1. A method of manufacturing a plurality of types of oscillators including a first oscillator and a second oscillator, the method comprising:
  housing a first resonator and a first integrated circuit device configured to oscillate the first resonator in a first container to manufacture the first oscillator; and housing a second resonator and a second integrated circuit device configured to oscillate the second resonator in a second container to manufacture the second oscillator, wherein the first integrated circuit device includes a first oscillation circuit configured to oscillate the first resonator to output a first oscillation signal, and no PLL circuit, the second integrated circuit device includes a second oscillation circuit configured to oscillate the second resonator to output a second oscillation signal, and a PLL circuit to which the second oscillation signal is input, and which is configured to output a third oscillation signal, the first integrated circuit device has a first plurality of pads, and the second integrated circuit device has a second plurality of pads, the first container has a first plurality of electrodes respectively connected to the first plurality of pads, and the second container has a second plurality of electrodes respectively connected to the second plurality of pads, and when the second integrated circuit device is housed in the first container, the first plurality of electrodes are respectively connected to the second plurality of pads.

2. The method of manufacturing the oscillator according to claim 1, wherein defining N as an integer equal to or greater than 2, the first plurality of electrodes of the first container correspond to first through N-th electrodes, the second plurality of electrodes of the second container correspond to (N+1)-th through 2N-th electrodes, the first plurality of pads of the first integrated circuit device correspond to first through N-th pads, the second plurality of pads of the second integrated circuit device has correspond to (N+1)-th through 2N-th pads, with respect to each of integers i no smaller than 1 and no greater than N, the i-th electrode is same in shape as the (N+i)-th electrode, and a position of the i-th electrode in the first container is same as a position of the (N+i)-th electrode in the second container, the manufacturing the first oscillator includes coupling the first through N-th pads respectively to the first through N-th electrodes, and the manufacturing the second oscillator includes coupling the (N+1)-th through 2N-th pads respectively to the (N+1)-th through 2N-th electrodes.

3. The method of manufacturing the oscillator according to claim 2, wherein with respect to each of the integers i, a position of the i-th pad in the first integrated circuit device is same as a position of the (N+i)-th pad in the second integrated circuit device.

4. The method of manufacturing the oscillator according to claim 1, wherein the first integrated circuit device and the second integrated circuit device are same in size as each other.

5. The method of manufacturing the oscillator according to claim 4, wherein the first integrated circuit device includes a first temperature compensation circuit configured to output a first temperature compensation signal configured to compensate a frequency-temperature characteristic of the first oscillation signal, and the PLL circuit is arranged in at least a part of a second area of the second integrated circuit device corresponding to a first area of the first integrated circuit device where the first temperature compensation circuit is arranged.

6. The method of manufacturing the oscillator according to claim 5, wherein the first temperature compensation circuit includes an RC lowpass filter configured to reduce a noise included in the first temperature compensation signal.

7. The method of manufacturing the oscillator according to claim 5, wherein the second integrated circuit device includes a second temperature compensation circuit configured to output a second temperature compensation signal configured to compensate a frequency-temperature characteristic of the second oscillation signal, a size of the second temperature compensation circuit is smaller than a size of the first temperature compensation circuit, and the PLL circuit and the second temperature compensation circuit are arranged in at least a part of the second area.

8. The method of manufacturing the oscillator according to claim 5, wherein the first integrated circuit device is configured to set whether to make the first temperature compensation circuit operate, and the manufacturing the first oscillator includes setting whether to make the first temperature compensation circuit operate.

9. The method of manufacturing the oscillator according to claim 1, wherein the first oscillation circuit includes a first amplifier circuit configured to amplify a signal from the first resonator to output the first oscillation signal, and a first current source having a first transistor configured to supply the first amplifier circuit with a first current, the second oscillation circuit includes a second amplifier circuit configured to amplify a signal from the second resonator to output the second oscillation signal, and a second current source having a second transistor configured to supply the second amplifier circuit with a second current, and the first transistor is larger in size than the second transistor.

10. The method of manufacturing the oscillator according to claim 1, wherein the second integrated circuit device is configured to set an operation of the PLL circuit to one of an integer PLL method and a fractional PLL method, and the manufacturing the second oscillator includes setting the operation of the PLL circuit to one of the integer PLL method and the fractional PLL method.

11. An oscillator included in an oscillator group consisting of a plurality of types of oscillators, the oscillator comprising:

a first resonator;

a first integrated circuit device configured to oscillate the first resonator; and a first container configured to house the first resonator and the first integrated circuit device, wherein the first integrated circuit device includes a first oscillation circuit configured to oscillate the first resonator to output a first oscillation signal, and no PLL circuit, another oscillator included in the oscillator group includes a second resonator, a second integrated circuit device configured to oscillate the second resonator, and a second container configured to house the second resonator and the second integrated circuit device, the second integrated circuit device includes a second oscillation circuit configured to oscillate the second resonator to output a second oscillation signal, and a PLL circuit to which the second oscillation signal is input, and which is configured to output a third oscillation signal, the first integrated circuit device has a first plurality of pads, and the second integrated circuit device has a second plurality of pads, the first container has a first plurality of electrodes respectively connected to the first plurality of pads, and the second container has a second plurality of electrodes respectively connected to the second plurality of pads, and when the second integrated circuit device is housed in the first container, the first plurality of electrodes are respectively connected to the second plurality of pads.

12. An oscillator included in an oscillator group consisting of a plurality of types of oscillators, the oscillator comprising:

a second resonator;

a second integrated circuit device configured to oscillate the second resonator; and a second container configured to house the second resonator and the second integrated circuit device, wherein the second integrated circuit device includes a second oscillation circuit configured to oscillate the second resonator to output a second oscillation signal, and a PLL circuit to which the second oscillation signal is input, and which is configured to output a third oscillation signal, another oscillator included in the oscillator group includes a first resonator, a first integrated circuit device configured to oscillate the first resonator, and a first container configured to house the first resonator and the first integrated circuit device, the first integrated circuit device includes a first oscillation circuit configured to oscillate the first resonator to output a first oscillation signal, and no PLL circuit, the first integrated circuit device has a first plurality of pads, and the second integrated circuit device has a second plurality of pads, the first container has a first plurality of electrodes respectively connected to the first plurality of pads, and the second container has a second plurality of electrodes respectively connected to the second plurality of pads, and when the second integrated circuit device is housed in the first container, the first plurality of electrodes are respectively connected to the second plurality of pads.

13. A method of manufacturing a plurality of types of oscillators including a first oscillator and a second oscillator, the method comprising:

housing a first resonator and a first integrated circuit device configured to oscillate the first resonator in a first container to manufacture the first oscillator; and housing a second resonator and a second integrated circuit device configured to oscillate the second resonator in a second container to manufacture the second oscillator, wherein the first integrated circuit device includes a first oscillation circuit configured to oscillate the first resonator to output a first oscillation signal, and no PLL circuit, the second integrated circuit device includes a second oscillation circuit configured to oscillate the second resonator to output a second oscillation signal, and a PLL circuit to which the second oscillation signal is input, and which is configured to output a third oscillation signal, the first integrated circuit device and the second integrated circuit device are same in size as each other.

* * * * *